US009524981B2

(12) United States Patent
Pachamuthu et al.

(10) Patent No.: US 9,524,981 B2
(45) Date of Patent: Dec. 20, 2016

(54) THREE DIMENSIONAL MEMORY DEVICE WITH HYBRID SOURCE ELECTRODE FOR WAFER WARPAGE REDUCTION

(71) Applicant: SANDISK TECHNOLOGIES INC., Plano, TX (US)

(72) Inventors: Jayavel Pachamuthu, San Jose, CA (US); Johann Alsmeier, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/703,367

(22) Filed: May 4, 2015

(65) Prior Publication Data
US 2016/0329343 A1 Nov. 10, 2016

(51) Int. Cl.
*H01L 27/115* (2006.01)
*H01L 21/3213* (2006.01)
*H01L 21/768* (2006.01)
*H01L 29/788* (2006.01)
*H01L 23/522* (2006.01)
*H01L 23/532* (2006.01)

(52) U.S. Cl.
CPC ..... *H01L 27/11582* (2013.01); *H01L 23/5226* (2013.01); *H01L 23/53271* (2013.01); *H01L 27/11556* (2013.01)

(58) Field of Classification Search
CPC ............... H01L 27/11582; H01L 27/115566; H01L 23/53271; H01L 23/5226; H01L 27/11517; H01L 29/788; H01L 29/42324; H01L 29/66825; H01L 29/792
See application file for complete search history.

(56) References Cited

U.S. PATENT DOCUMENTS

| 5,915,167 A | 6/1999 | Leedy |
| 2011/0151667 A1 | 6/2011 | Hwang et al. |
| 2013/0126957 A1 | 5/2013 | Higashitani et al. |
| 2015/0179662 A1* | 6/2015 | Makala ............ H01L 27/11582 257/314 |

(Continued)

OTHER PUBLICATIONS

Office Communication Concerning Corresponding U.S. Appl. No. 14/501,539, filed Sep. 30, 2014, (19 pages).

(Continued)

*Primary Examiner* — Thomas L Dickey
*Assistant Examiner* — Damon Hillman
(74) *Attorney, Agent, or Firm* — The Marbury Law Group PLLC

(57) ABSTRACT

The metallic material content of a contact via structure for a three-dimensional memory device can be reduced by employing a vertical stack of a doped semiconductor material portion and a metallic fill material portion. A backside contact via can be filled with an outer metallic layer, a lower conductive material portion, an inner metallic layer, and an upper conductive material portion to form a contact via structure such that one of the lower and upper conductive material portions is a doped semiconductor material portion and the other is a metallic fill material portion. The doped semiconductor material generates less stress than the metallic fill material per volume, and thus, the contact via structure can reduce stress applied to surrounding regions in the three-dimensional memory device.

29 Claims, 24 Drawing Sheets

(56) References Cited

U.S. PATENT DOCUMENTS

2016/0056235 A1* 2/2016 Lee .................. H01L 21/76805
257/522

OTHER PUBLICATIONS

U.S. Appl. No. 14/133,979, filed Dec. 19, 2013, SanDisk Technologies Inc.
U.S. Appl. No. 14/225,116, filed Mar. 25, 2014, SanDisk Technologies Inc.
U.S. Appl. No. 14/225,176, filed Mar. 25, 2014, SanDisk Technologies Inc.
U.S. Appl. No. 14/468,743, filed Aug. 26, 2014, SanDisk Technologies Inc.
U.S. Appl. No. 14/501,539, filed Sep. 30, 2014, SanDisk Technologies Inc.
U.S. Appl. No. 14/491,315, filed Sep. 19, 2014, SanDisk Technologies Inc.
U.S. Appl. No. 14/491,026, filed Sep. 19, 2014, SanDisk Technologies Inc.
U.S. Appl. No. 14/462,209, filed Aug. 14, 2014, SanDisk Technologies Inc.
U.S. Appl. No. 14/540,479, filed Nov. 13, 2014, SanDisk Technologies Inc.
U.S. Appl. No. 14/602,491, filed Jan. 22, 2015, SanDisk Technologies Inc.
Endoh et al., "Novel Ultra High Density Memory with a Stacked-Surrounding Gate Transistor (S-SGT) Structured Cell," IEDM Proc. (2001) 33-36.

* cited by examiner

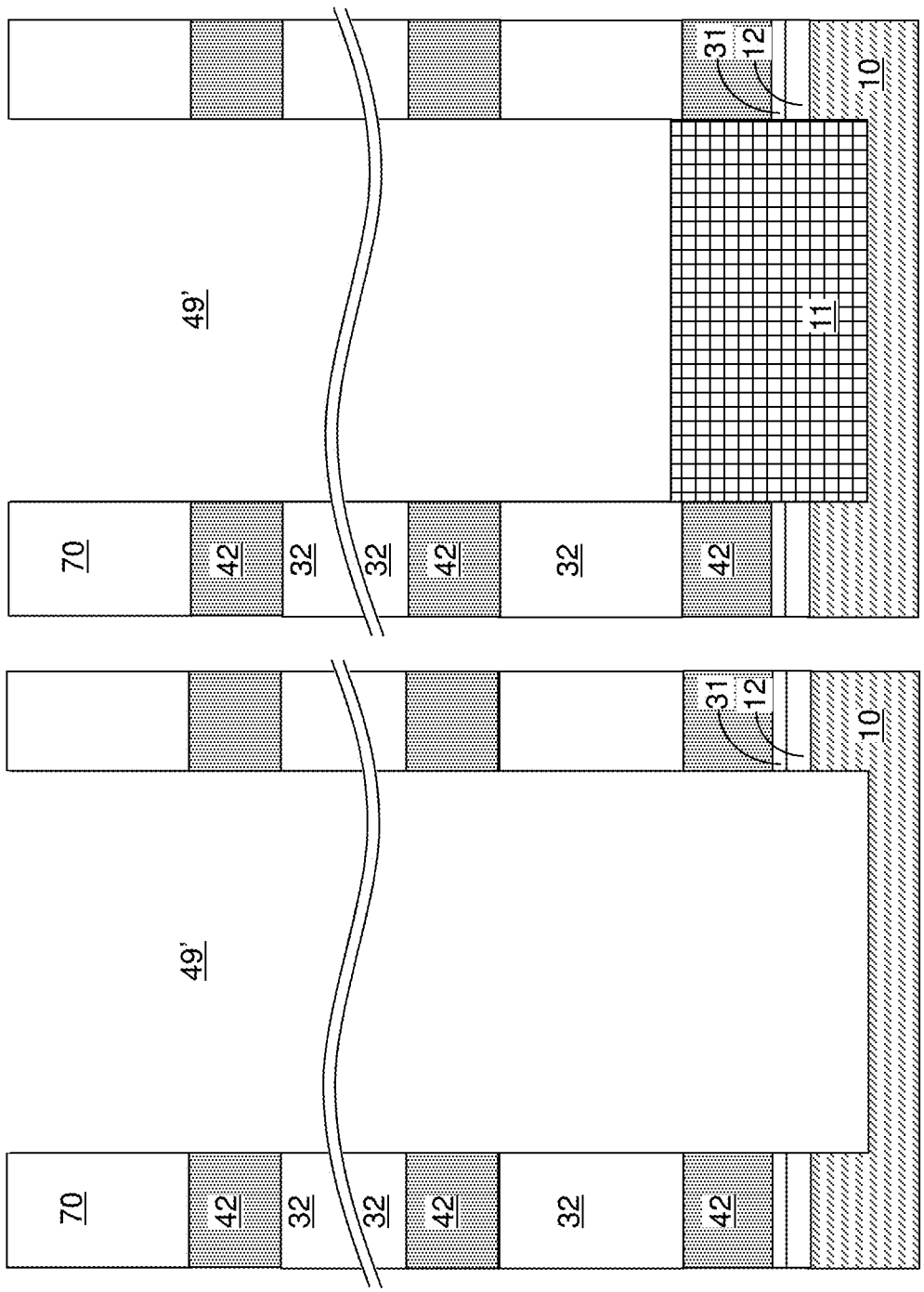

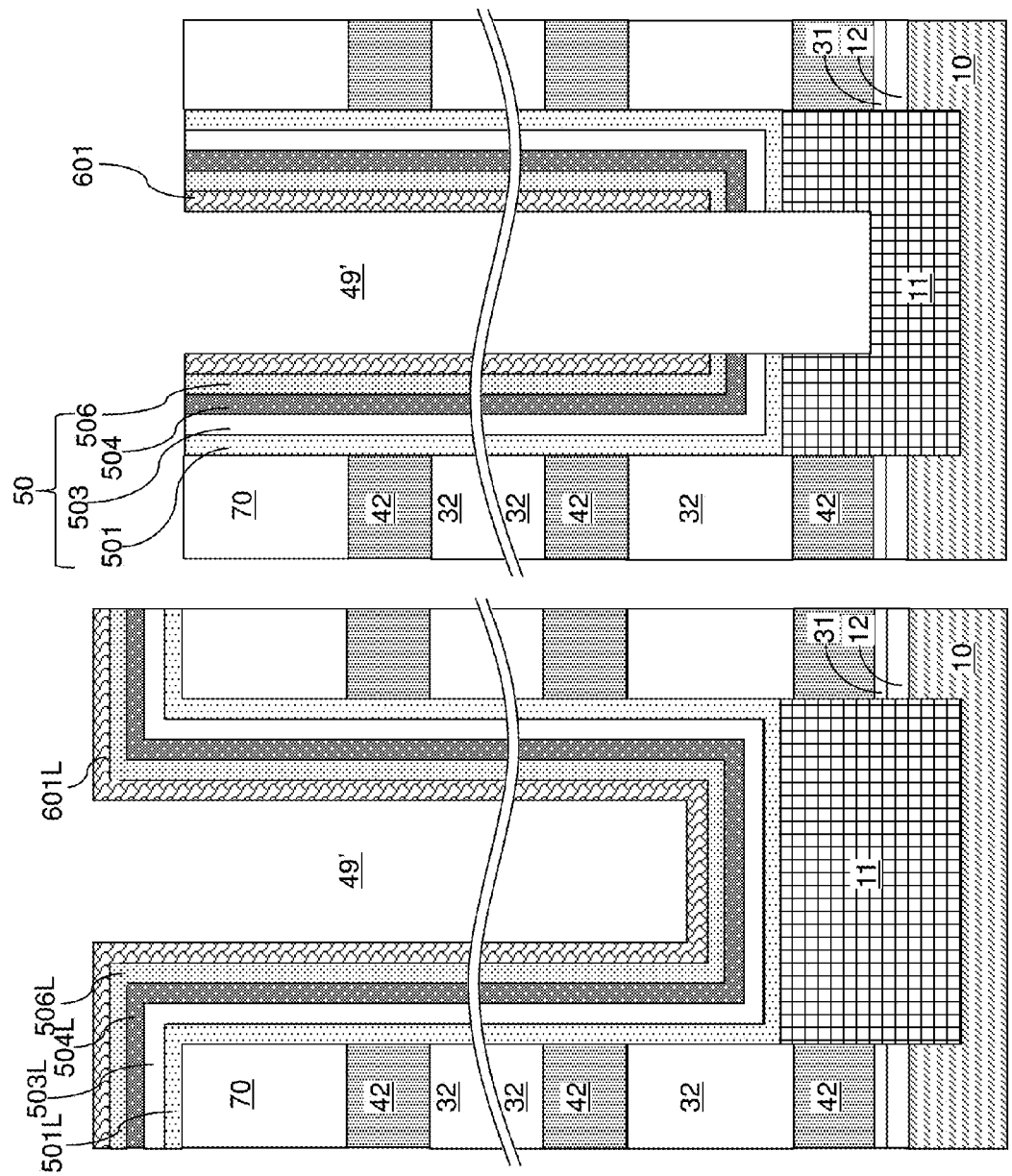

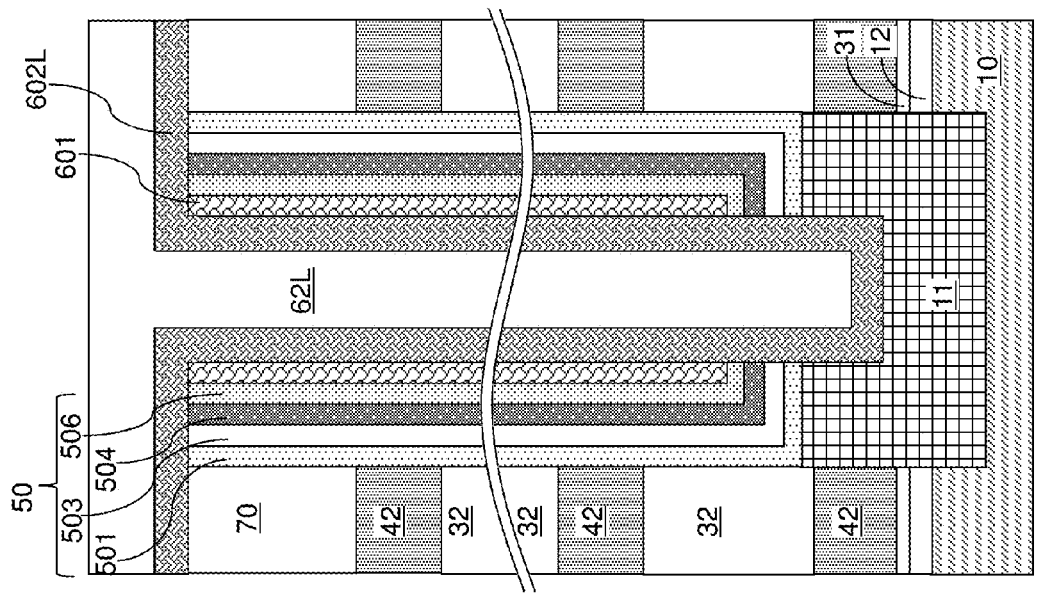
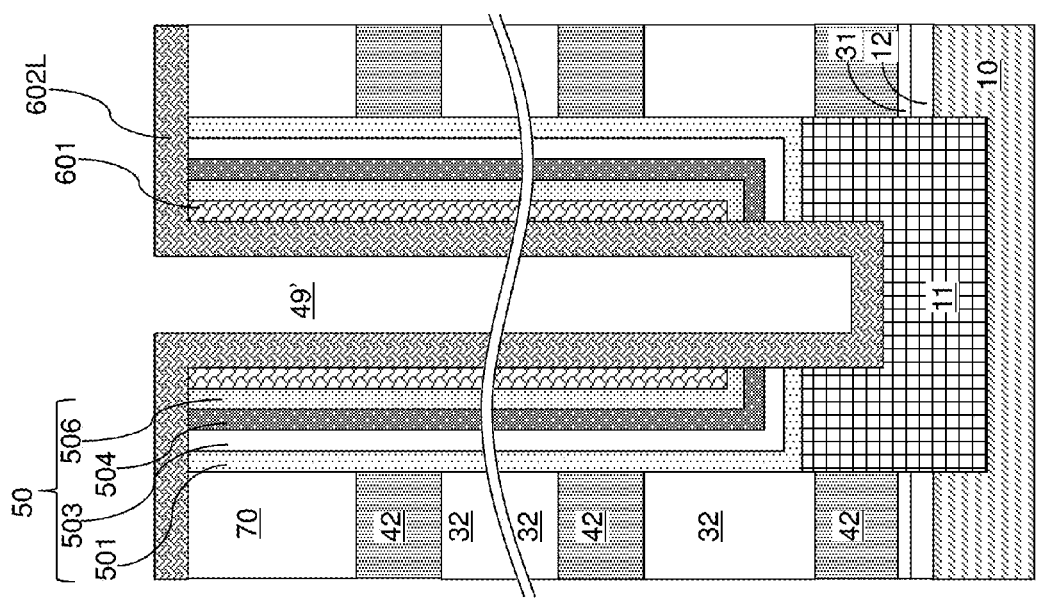

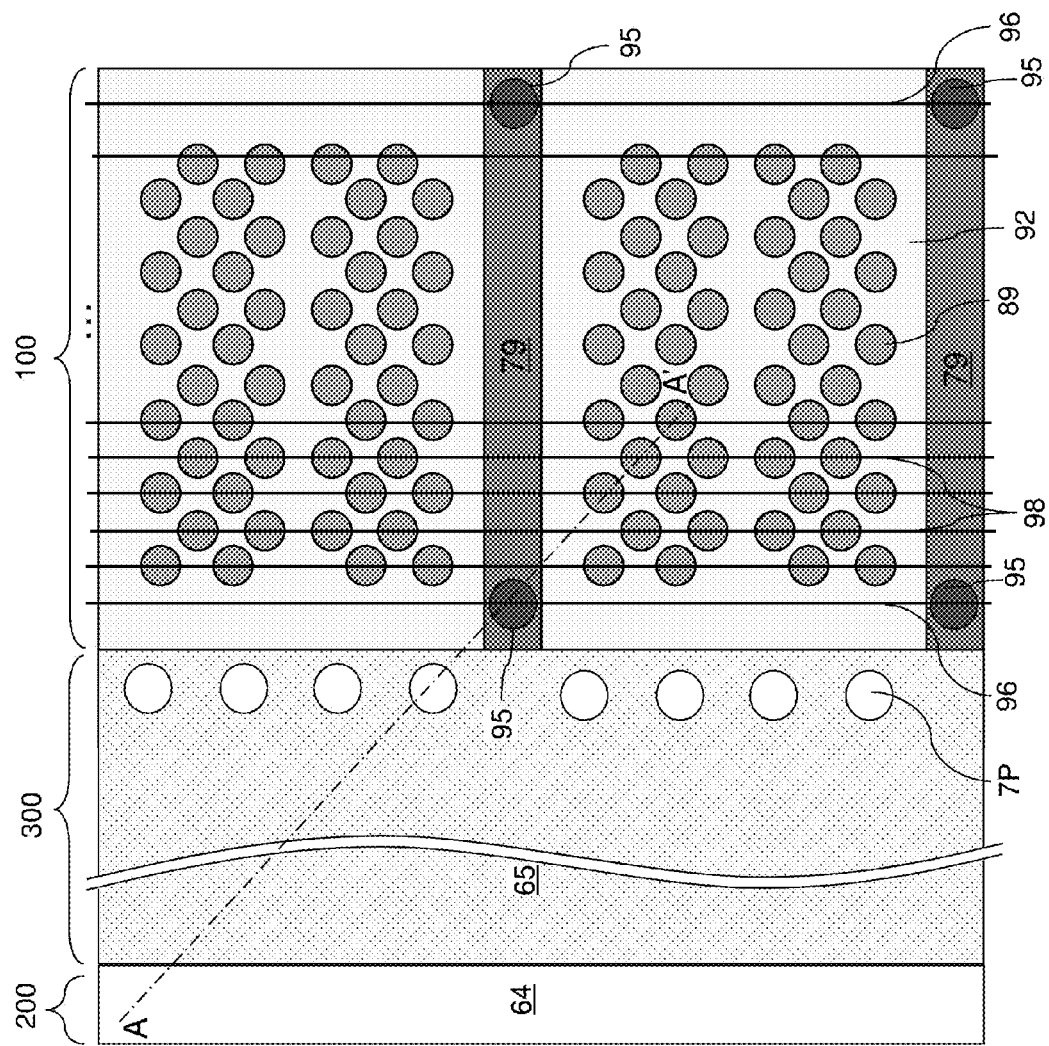

THREE DIMENSIONAL MEMORY DEVICE WITH HYBRID SOURCE ELECTRODE FOR WAFER WARPAGE REDUCTION

FIELD

The present disclosure relates generally to the field of three-dimensional memory devices and specifically to three-dimensional memory devices including a vertical stack of multilevel memory arrays and methods of making thereof.

BACKGROUND

Three-dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a monolithic three-dimensional memory device is provided, which comprises a stack of alternating layers comprising insulating layers and electrically conductive layers and located over a substrate; a memory stack structure extending through the stack and comprising a semiconductor channel; a trench vertically extending through the stack; and a contact via structure located in the trench, electrically connected to an end of the semiconductor channel, and comprising a vertical stack of a lower conductive material portion and an upper conductive material portion. One of the lower conductive material portion and the upper conductive material portion comprises a doped semiconductor material portion. Another of the lower conductive material portion and the upper conductive material portion comprises a metallic fill material portion. The lower conductive material portion and the upper conductive material portion are vertically spaced from each other by a substantially horizontal portion of an inner metallic layer.

According to another aspect of the present disclosure, a method of manufacturing a device structure is provided. A stack of alternating layers comprising first material layers and second material layers is formed over a substrate. A trench is formed through the stack to a surface of the substrate. An outer metallic layer is formed on a sidewall of the trench. A first conductive material is deposited on the outer metallic layer to completely fill a space in the outer metallic layer and an upper portion of the first conductive material is recessed within the trench. A remaining portion of the first conductive material comprises a lower conductive material portion and a cavity is present above the lower conductive material portion within the trench. An inner metallic layer is formed in a peripheral region of the cavity. The cavity is filled with an upper conductive material portion comprising a second conductive material. A contact via structure comprising the outer metallic layer, the lower conductive material portion, the inner metallic layer, and the upper conductive material portion is formed in the trench. One of the first and second conductive materials comprises a doped semiconductor material. Another of the first and second conductive materials comprises a metallic fill material.

BRIEF DESCRIPTION OF THE DRAWINGS

FIGS. 2A-2H are sequential vertical cross-sectional views of a memory opening within the first exemplary structure during various processing steps employed to form a memory stack structure according to the first embodiment of the present disclosure.

FIG. 19B is a partial see-through top-down view of the first exemplary structure of FIG. 19A. The vertical plane A-A' is the plane of the vertical cross-sectional view of FIG. 19A.

DETAILED DESCRIPTION

Figure 1:
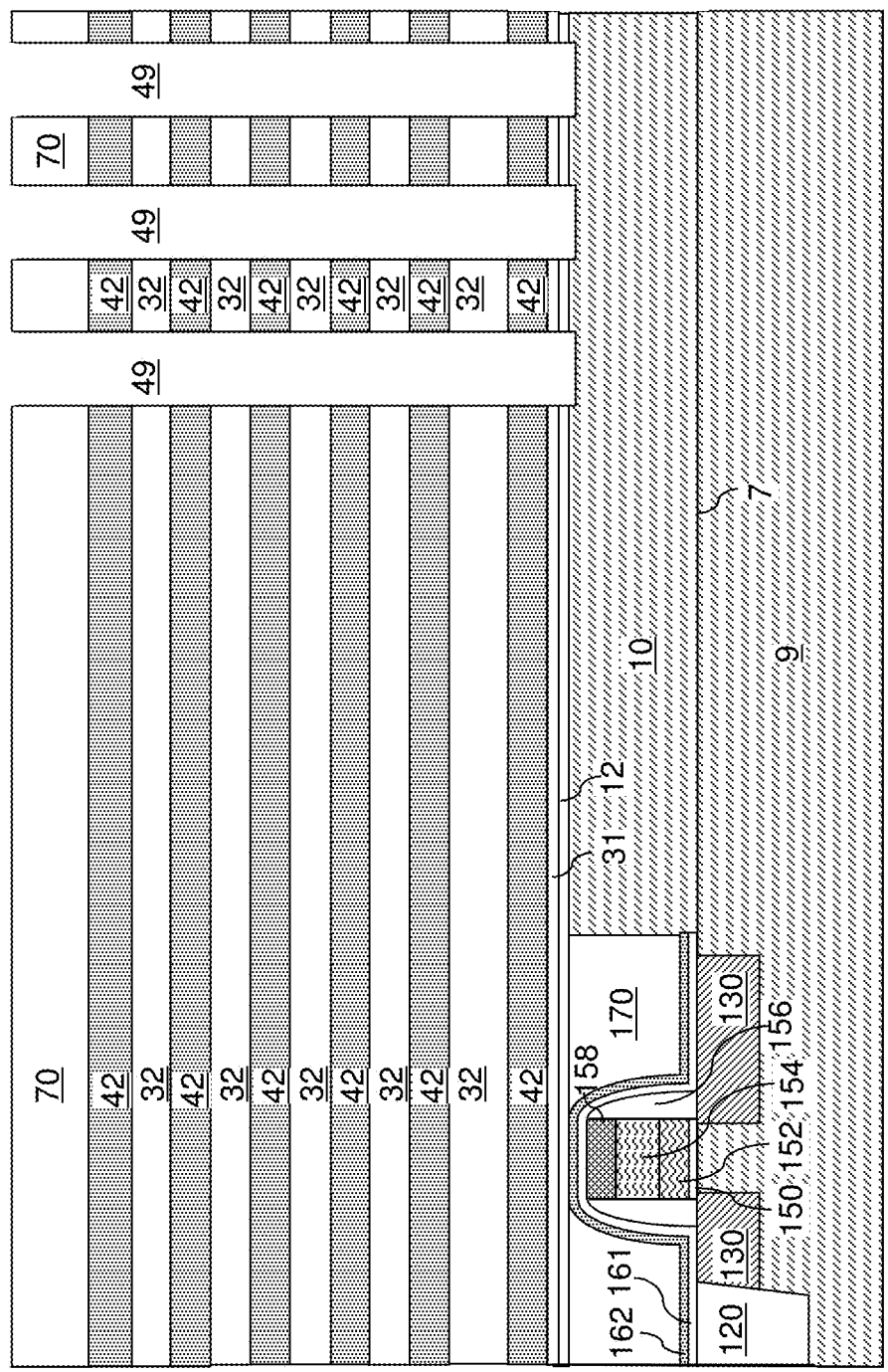
FIG. 1 is a vertical cross-sectional view of a first exemplary structure after formation of a stack including an alternating plurality of first material layers and second material layers and memory openings extending through the stack according to a first embodiment of the present disclosure.

As discussed above, the present disclosure is directed to three-dimensional memory structures, such as vertical NAND strings and other three-dimensional devices, and methods of making thereof, the various aspects of which are described below. An embodiment of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a substantially uniform thickness. A layer may extend over the entirety of an underlying or overlying structure, or may have an extent less than the extent of an underlying or overlying structure. Further, a layer may be a region of a homogeneous or inhomogeneous contiguous structure that has a thickness less than the thickness of the contiguous structure. For example, a layer may be located between any pair of horizontal planes between, or at, a top surface and a bottom surface of the contiguous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to an embodiment of the present disclosure is illustrated, which can be employed, for example, to fabricate a device structure containing vertical NAND memory devices. The first exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface.

As used herein, a "semiconductor material" refers to a material having electrical conductivity in the range from $1.0 \times 10^{-6}$ S/cm to $1.0 \times 10^{5}$ S/cm, and is capable of producing a doped material having electrical resistivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. A material is "semiconducting" if the conductivity of the material is in a range from $1.0 \times 10^{-6}$ S/cm to $1.0 \times 10^{5}$ S/cm. All measurements for electrical conductivities are made at the standard condition. Optionally, at least one doped well (not expressly shown) can be formed within the substrate semiconductor layer 9.

At least one semiconductor device for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric layer 161 and a second dielectric layer 162 can be optionally formed. Each of the first and second dielectric layers (161, 162) can comprise a silicon oxide layer, a silicon nitride layer, and/or a dielectric metal oxide layer. In an illustrative example, the first dielectric layer 161 can be a silicon oxide layer, and the second dielectric layer 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric layers (161, 162). Subsequently, the planarization dielectric layer 170 and the dielectric layers (161, 162) can be removed from an area to physically expose a top surface of the substrate semiconductor layer 9.

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

Optionally, a dielectric pad layer 12 can be formed above the semiconductor material layer 10 and the planarization dielectric layer 170. The dielectric pad layer 12 can be, for example, silicon oxide layer. The thickness of the dielectric pad layer 12 can be in a range from 3 nm to 30 nm, although lesser and greater thicknesses can also be employed.

A dielectric cap layer 31 can be optionally formed. The dielectric cap layer 31 includes a dielectric material, and can be formed over the at least one gate structure (150, 152, 154, 158). Exemplary materials that can be employed for the dielectric cap layer 31 include, but are not limited to, silicon oxide, a dielectric metal oxide, and silicon nitride (in case the material of second material layers to be subsequently formed is not silicon nitride). The dielectric cap layer 31 provides electrical isolation for the at least one gate structure (150, 152, 154, 158).

A stack of an alternating plurality of first material layers (which can be insulating layers 32) and second material layers (which can be sacrificial material layer 42) is formed over the top surface of the substrate, which can be, for example, on the top surface of the dielectric cap layer 31. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Subsequently, a lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the dielectric cap layer 31 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The memory openings 49 are formed through the dielectric cap layer 31 and the dielectric pad layer 12 so that the memory openings 49 extend from the top surface of the alternating stack (32, 42) to the top surface of the semiconductor material layer 10 within the substrate. In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the semiconductor material layer 10.

A memory stack structure can be formed in each of the memory opening employing various embodiments of the present disclosure. FIGS. 2A-2H illustrate sequential vertical cross-sectional views of a memory opening within the first exemplary structure during formation of an exemplary memory stack structure according to a embodiment of the present disclosure. Formation of the exemplary memory stack structure can be performed within each of the memory openings 49 in the first exemplary structure illustrated in FIG. 1.

Referring to FIG. 2A, a memory opening 49 in the first exemplary structure of FIG. 1 is illustrated. The memory opening 49 extends through the insulating cap layer 70, the alternating stack (32, 42), the dielectric cap layer 31, the dielectric pad layer 12, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 2B, an optional epitaxial channel portion 11 can be formed at the bottom portion of each memory opening 49, for example, by selective epitaxy. Each epitaxial channel portion 11 comprises a single crystalline semiconductor material in epitaxial alignment with the single crystalline semiconductor material of the semiconductor material layer 10. In one embodiment, the epitaxial channel portion 11 can be doped with electrical dopants of the same conductivity type as the semiconductor material layer 10. In one embodiment, the top surface of each epitaxial channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial channel portions 11 with a respective conductive material layer.

Referring to FIG. 2C, a series of layers including at least one blocking dielectric layer (501L, 503L), a memory material layer 504L, a tunneling dielectric layer 506L, and an optional first semiconductor channel layer 601L can be sequentially deposited in the memory openings 49. The at least one blocking dielectric layer (501L, 503L) can include, for example, a first blocking dielectric layer 501L and a second blocking dielectric layer 503L.

The first blocking dielectric layer 501L can be deposited on the sidewalls of each memory opening 49 by a conformal deposition method. The first blocking dielectric layer 501L includes a dielectric material, which can be a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the first blocking dielectric layer 501L can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The first blocking dielectric layer 501L can be deposited, for example, by chemical vapor deposition (CVD), atomic layer deposition (ALD), pulsed laser deposition (PLD), liquid source misted chemical deposition, or a combination thereof. The thickness of the first blocking dielectric layer 501L can be in a range from 1 nm to 20 nm, although lesser and greater thicknesses can also be employed. The first blocking dielectric layer 501L can subsequently function as a dielectric material portion that blocks leakage of stored electrical charges to control gate electrodes. In one embodiment, the first blocking dielectric layer 501L includes aluminum oxide.

The second blocking dielectric layer 503L can be formed on the first blocking dielectric layer 501L. The second blocking dielectric layer 503L can include a dielectric material that is different from the dielectric material of the first blocking dielectric layer 501L. In one embodiment, the second blocking dielectric layer 503L can include silicon oxide, a dielectric metal oxide having a different composition than the first blocking dielectric layer 501L, silicon oxynitride, silicon nitride, or a combination thereof. In one embodiment, the second blocking dielectric layer 503L can include silicon oxide. The second blocking dielectric layer 503L can be formed by a conformal deposition method such as low pressure chemical vapor deposition, atomic layer deposition, or a combination thereof. The thickness of the second blocking dielectric layer 503L can be in a range from 1 nm to 20 nm, although lesser and greater thicknesses can also be employed. Alternatively, the first blocking dielectric layer 501L and/or the second blocking dielectric layer 503L can be omitted, and a blocking dielectric layer can be formed after formation of backside recesses on surfaces of memory films to be subsequently formed.

Subsequently, the memory material layer 504L, the tunneling dielectric layer 506L, and the optional first semiconductor channel layer 601L can be sequentially formed. In one embodiment, the memory material layer 504L can be a charge trapping material including a dielectric charge trapping material, which can be, for example, silicon nitride. Alternatively, the memory material layer 504L can include a conductive material such as doped polysilicon or a metallic material that is patterned into multiple electrically isolated portions (e.g., floating gates), for example, by being formed within lateral recesses into sacrificial material layers 42. In one embodiment, the memory material layer 504L includes a silicon nitride layer.

The memory material layer 504L can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 504L may comprise an insulating charge trapping material, such as one or more silicon nitride segments. Alternatively, the memory material layer 504L may comprise conductive nanoparticles such as metal nanoparticles, which can be, for example, ruthenium nanoparticles. The memory material layer 504L can be formed, for example, by chemical vapor deposition (CVD), atomic layer deposition (ALD), physical vapor deposition (PVD), or any suitable deposition technique for storing electrical charges therein. The thickness of the memory material layer 504L can be in a range from 2 nm to 20 nm, although lesser and greater thicknesses can also be employed.

The tunneling dielectric layer 506L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 506L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 506L can include a stack of a first silicon oxide layer, a silicon oxynitride layer, and a second silicon oxide layer, which is commonly known as an ONO stack. In one embodiment, the tunneling dielectric layer 506L can include a silicon oxide layer that is substantially free of carbon or a silicon oxynitride layer that is substantially free of carbon. The thickness of the tunneling dielectric layer 506L can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (501L, 503L, 504L, 5061, 601L).

Referring to FIG. 2D, the optional first semiconductor channel layer 601L, the tunneling dielectric layer 506L, the memory material layer 504L, the at least one blocking dielectric layer (501L, 503L) are sequentially anisotropically etched employing at least one anisotropic etch process. The portions of the first semiconductor channel layer 601L, the tunneling dielectric layer 506L, the memory material layer 504L, and the at least one blocking dielectric layer (501L, 503L) located above the top surface of the insulating cap layer 70 can be removed by the at least one anisotropic etch process. Further, the horizontal portions of the first semiconductor channel layer 601L, the tunneling dielectric layer 506L, the memory material layer 504L, and the at least one blocking dielectric layer (501L, 503L) at a bottom of each cavity 49' can be removed to form openings in remaining portions thereof. Each of the first semiconductor channel layer 601L, the tunneling dielectric layer 506L, the memory material layer 504L, and the at least one blocking dielectric layer (501L, 503L) can be etched by anisotropic etch process.

Each remaining portion of the first semiconductor channel layer 601L constitutes a first semiconductor channel portion 601. Each remaining portion of the tunneling dielectric layer 506L constitutes a tunneling dielectric 506. Each remaining portion of the memory material layer 504L is herein referred to as a charge storage element 504. In one embodiment, the charge storage element 504 can be a contiguous layer, i.e., can be a charge storage layer. Each remaining portion of the second blocking dielectric layer 503L is herein referred to as a second blocking dielectric 503. Each remaining portion of the first blocking dielectric layer 501L is herein referred to as a first blocking dielectric 501. A surface of the epitaxial channel portion 11 can be physically exposed underneath the opening through the first semiconductor channel portion 601, the tunneling dielectric 506, the charge storage element 504, and the at least one blocking dielectric (501, 503). Optionally, the physically exposed portion of the epitaxial channel portion 11 can be vertically recessed. A tunneling dielectric 506 is embedded within a charge storage element 504. The charge storage element 504 can comprise a charge trapping material or a floating gate material.

The set of the tunneling dielectric 506, the charge storage element 504, the second blocking dielectric 503, and the first blocking dielectric 501 collectively constitutes a memory film 50. In one embodiment, the first semiconductor channel portion 601, the tunneling dielectric 506, the charge storage element 504, the second blocking dielectric 503, and the first blocking dielectric 501 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Referring to FIG. 2E, a second semiconductor channel layer 602L can be deposited directly on the semiconductor surface of the epitaxial channel portion 11 over the substrate (9, 10), and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Referring to FIG. 2F, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 2H:
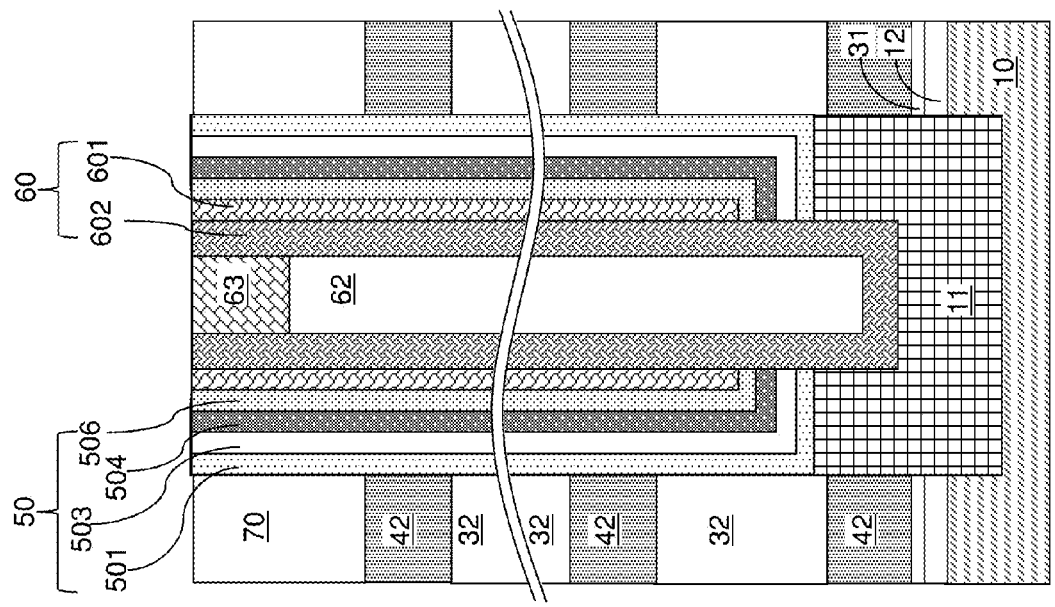
Figure 2G:
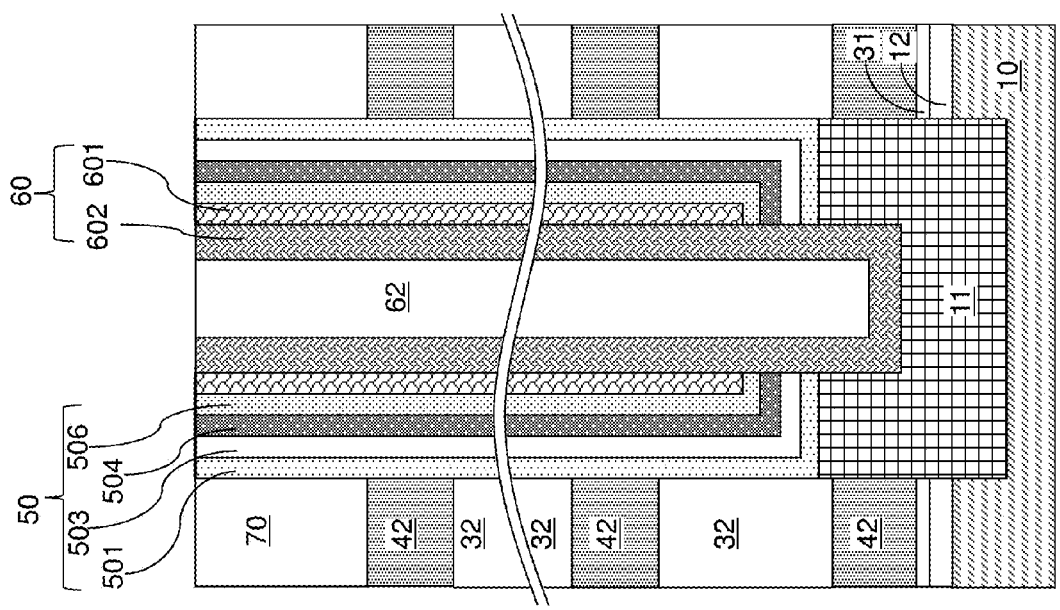

Referring to FIG. 2G, the horizontal portion of the dielectric core layer 62L can be removed, for example, by a recess etch from above the top surface of the insulating cap layer 70. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric 506 is embedded within a charge storage element 504, and laterally surrounds a portion of the semiconductor channel 60. Each adjoining set of a first blocking dielectric 501, a second blocking dielectric 503, a charge storage element 504, and a tunneling dielectric 506 collectively constitute a memory film 50, which can store electrical charges with a macroscopic retention time. In some embodiments, a first blocking dielectric 501 and/or a second blocking dielectric 503 may not be present in the memory film 50 at this step, and a blocking dielectric may be subsequently formed after formation of backside recesses. As used herein, a macroscopic retention time refers to a retention time suitable for operation of a memory device as a permanent memory device such as a retention time in excess of 24 hours.

The top surface of the remaining portion of the dielectric core layer 62L can be further recessed within each memory opening, for example, by a recess etch to a depth that is located between the top surface of the insulating cap layer 70 and the bottom surface of the insulating cap layer 70. Each remaining portion of the dielectric core layer 62L constitutes a dielectric core 62.

Referring to FIG. 2H, drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Figure 3:
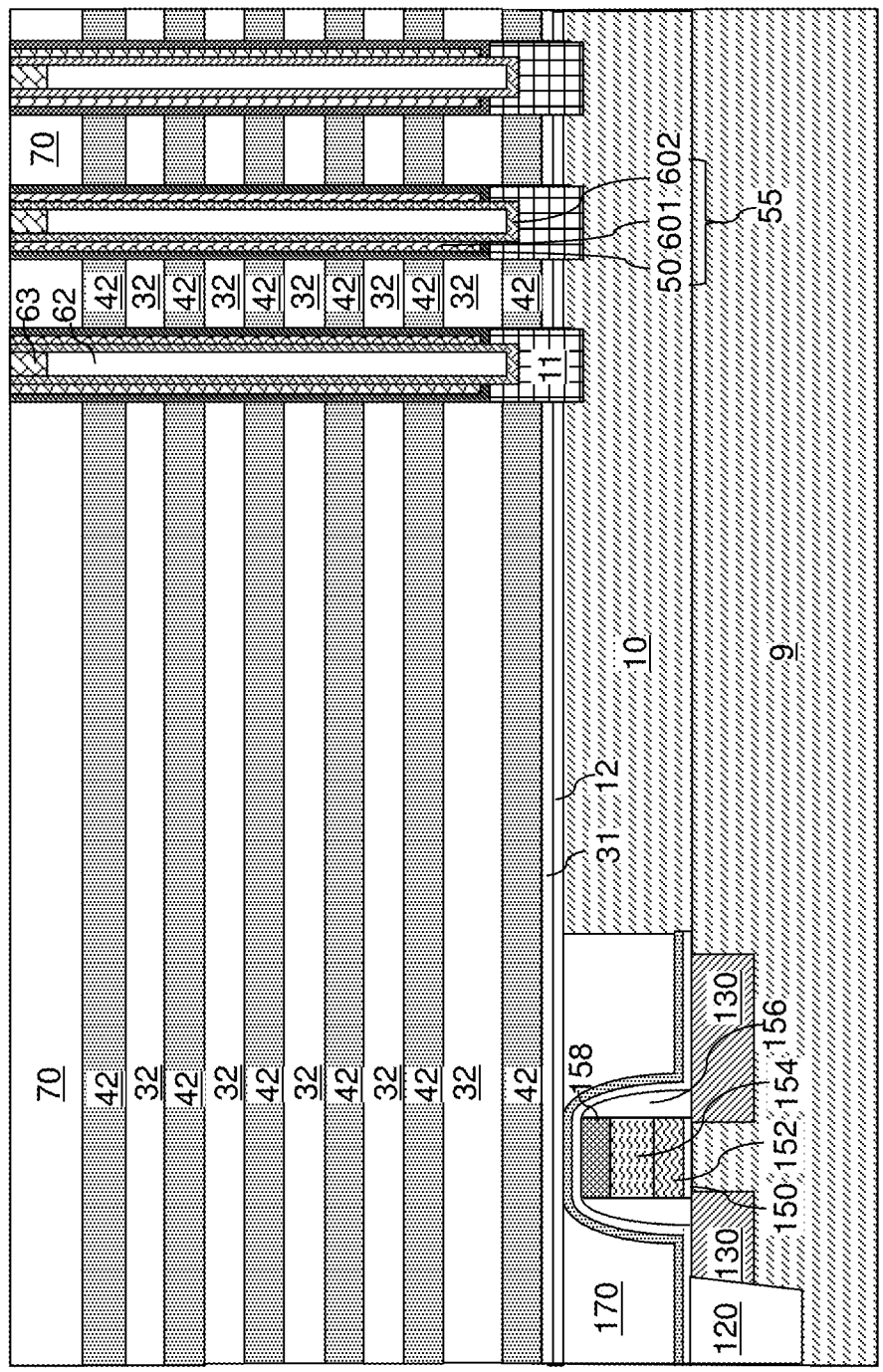
FIG. 3 is a vertical cross-sectional view of the first exemplary structure after formation of memory stack structures according to the first embodiment of the present disclosure.

The exemplary memory stack structure can be embedded into the first exemplary structure illustrated in FIG. 1. FIG. 3 illustrates the first exemplary structure that incorporates multiple instances of the exemplary memory stack structure of FIG. 2H. The first exemplary structure includes a semiconductor device, which comprises a stack (32, 42) including an alternating plurality of material layers (e.g., the sacrificial material layers 42) and insulating layers 32 located over a semiconductor substrate (9, 10), and a memory opening extending through the stack (32, 42). The semiconductor device further comprises a first blocking dielectric 501 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. While the present disclosure is described employing the illustrated configuration for the memory stack structure, the methods of the present disclosure can be applied to alternative memory stack structures including a polycrystalline semiconductor channel.

Figure 4:
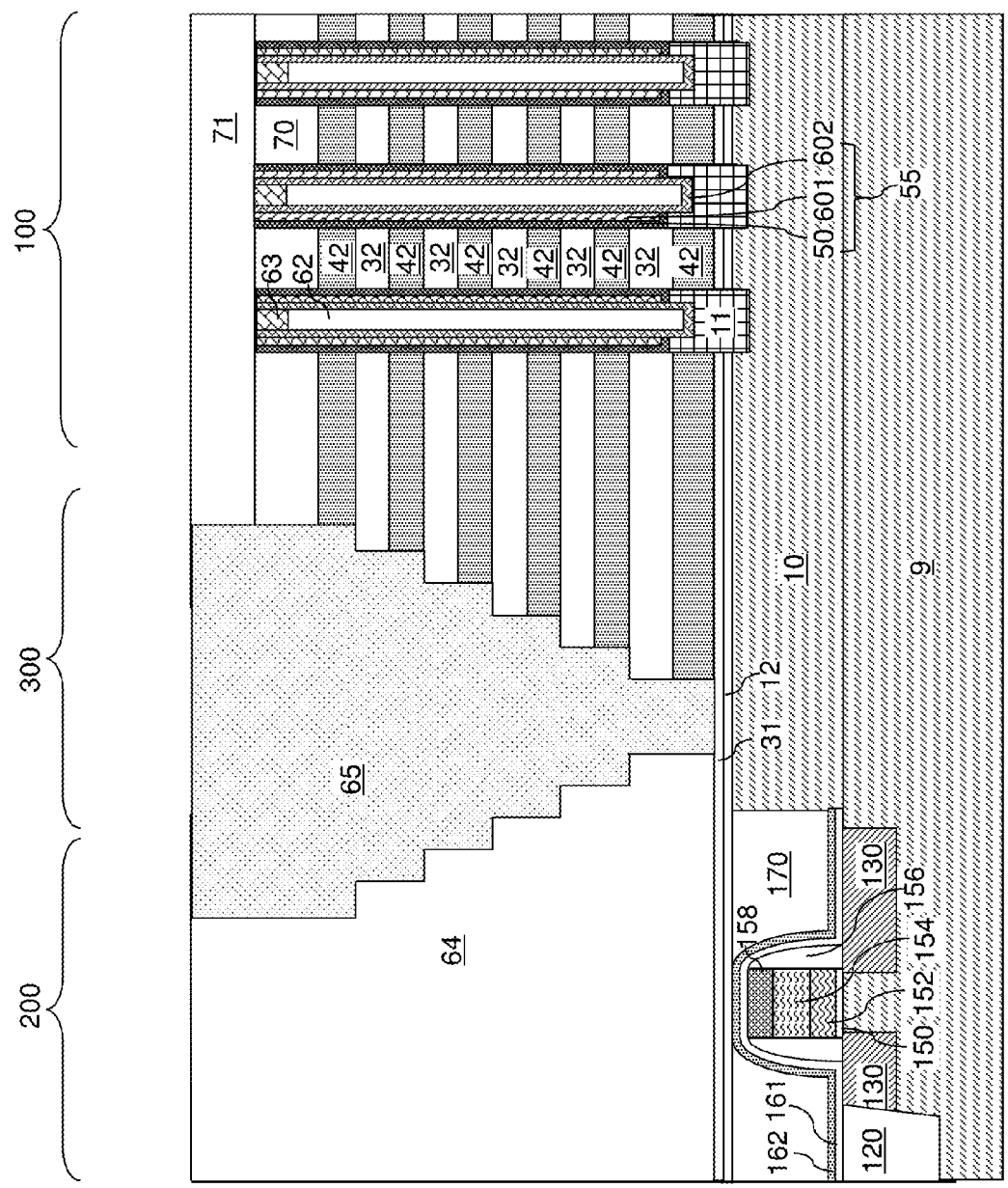
FIG. 4 is a vertical cross-sectional view of the first exemplary structure after formation of a stepped terrace and a retro-stepped dielectric material portion according to the first embodiment of the present disclosure.

Referring to FIG. 4, an optional first contact level dielectric layer 71 can be formed over the substrate (9, 10). As an optional structure, the first contact level dielectric layer 71 may, or may not, be formed. In case the first contact level dielectric layer 71 is formed, the first contact level dielectric layer 71 includes a dielectric material such as silicon oxide, silicon nitride, silicon oxynitride, porous or non-porous organosilicate glass (OSG), or a combination thereof. If an organosilicate glass is employed, the organosilicate glass may, or may not, be doped with nitrogen. The first contact level dielectric layer 71 can be formed over a horizontal plane including the top surface of the insulating cap layer 70 and the top surfaces of the drain regions 63. The first contact level dielectric layer 71 can be deposited by chemical vapor deposition, atomic layer deposition (ALD), spin-coating, or a combination thereof. The thickness of the first contact level dielectric layer 71 can be in a range from 10 nm to 300 nm, although lesser and greater thicknesses can also be employed.

In one embodiment, the first contact level dielectric layer 71 can be formed as a dielectric material layer having a uniform thickness throughout. The first contact level dielectric layer 71 may be formed as a single dielectric material layer, or can be formed as a stack of a plurality of dielectric material layers. Alternatively, formation of the first contact level dielectric layer 71 may be merged with formation of at least one line level dielectric layer (not shown). While the present disclosure is described employing an embodiment in which the first contact level dielectric layer 71 is a structure separate from an optional second contact level dielectric layer or at least one line level dielectric layer to be subsequently deposited, embodiments in which the first contact level dielectric layer 71 and at least one line level dielectric layer are formed at a same processing step, and/or as a same material layer, are expressly contemplated herein.

Optionally, a portion of the alternating stack (32, 42) can be removed, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed within an area that includes a peripheral device region 200 and a portion of a contact region 300, which is adjacent to a device region 100 that includes an array of memory stack structures 55. Subsequently, the trench can be filled with an optional dielectric material such as silicon oxide. Excess portions of the dielectric material can be removed from above the top surface of the first contact level dielectric layer 71 by a planarization process such as chemical mechanical planarization and/or a recess etch. The top surfaces of the first contact level dielectric layer 71 can be employed as a stopping surface during the planarization. The remaining dielectric material in the trench constitutes a dielectric material portion 64.

A stepped cavity can be formed within the contact region 300, which can straddle the dielectric material portion 64 and a portion of the alternating stack (32, 42). Alternatively, the dielectric material portion 64 may be omitted and the stepped cavity 69 may be formed directly in the stack (32, 42). The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

The dielectric material portion 64 can have stepped surfaces after formation of the stepped cavity, and a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the first contact level dielectric layer 71, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 5A:
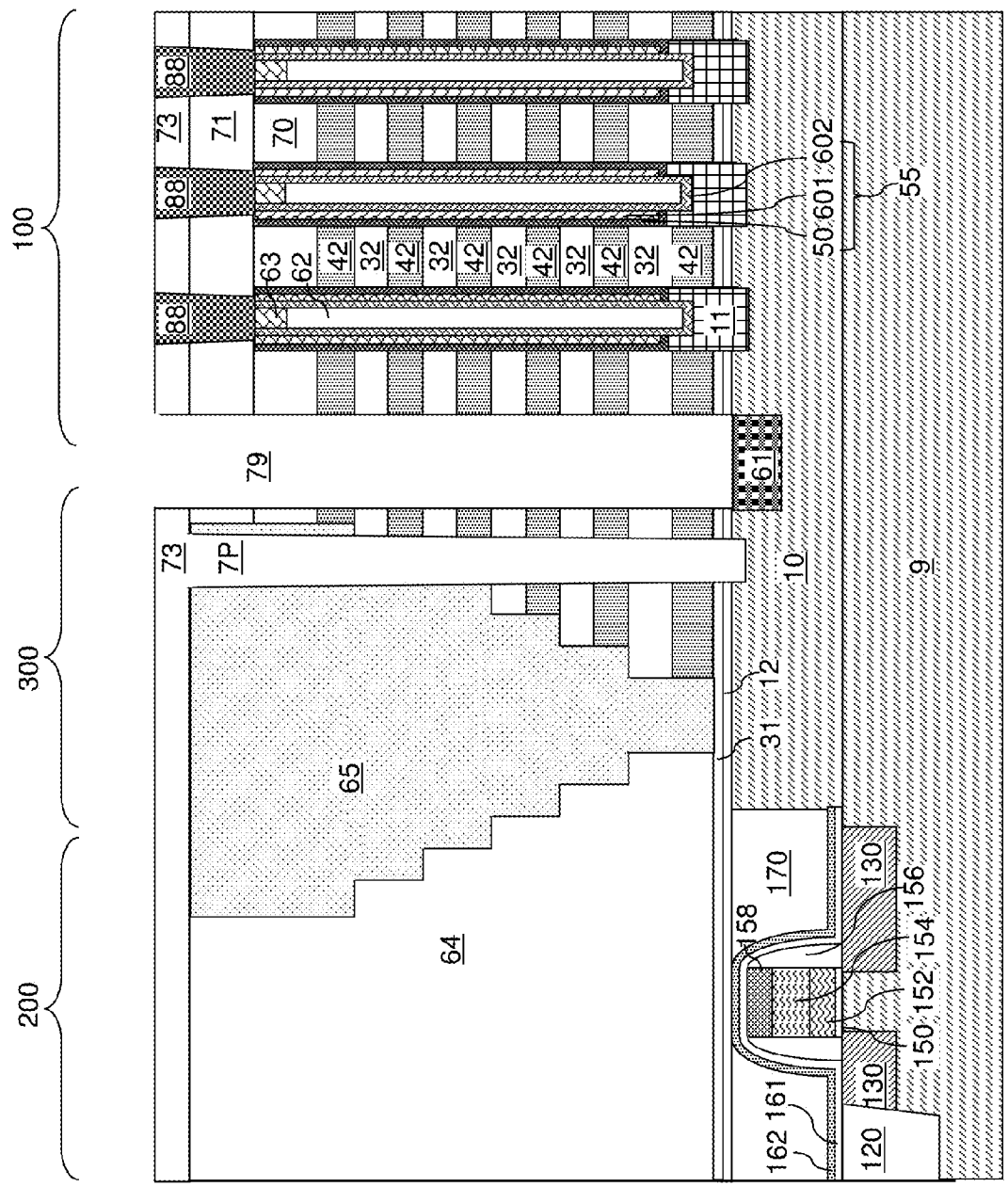
FIG. 5A is a vertical cross-sectional view of the first exemplary structure after formation of a backside contact trench according to the first embodiment of the present disclosure.
Figure 5B:
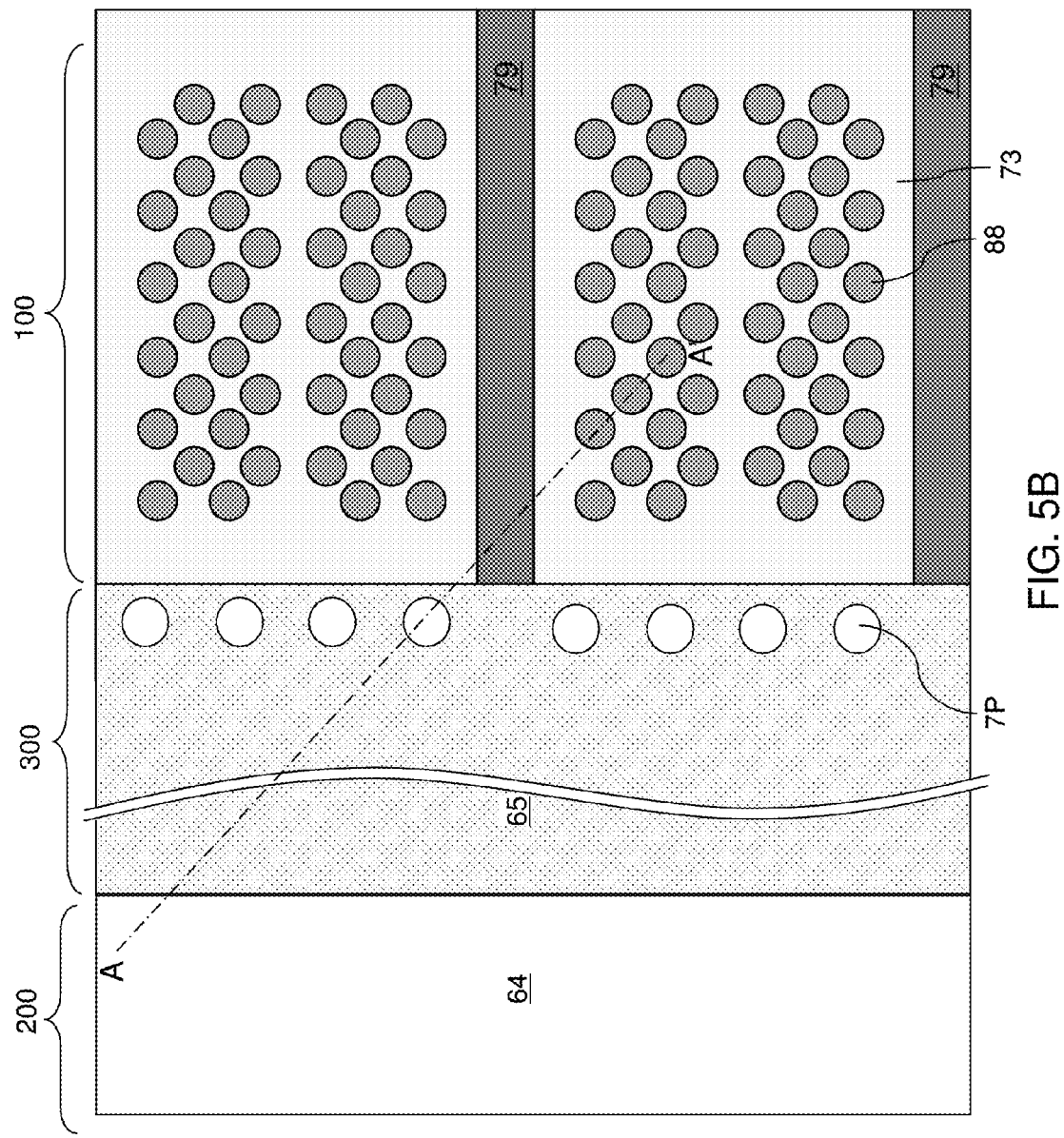
FIG. 5B is a partial see-through top-down view of the first exemplary structure of FIG. 5A. The vertical plane A-A' is the plane of the vertical cross-sectional view of FIG. 5A.

Referring to FIGS. 5A and 5B, at least one dielectric support pillar 7P may be optionally formed through the retro-stepped dielectric material portion 65 and/or through the first contact level dielectric layer 71 and/or through the alternating stack (32, 42). The plane A-A' in FIG. 5B corresponds to the plane of the vertical cross-sectional view of FIG. 5A. In one embodiment, the at least one dielectric support pillar 7P can be formed in the contact region 300, which is located adjacent to the device region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the sacrificial material layers 42.

In one embodiment, the at least one dielectric support pillar can include silicon oxide and/or a dielectric metal oxide such as aluminum oxide. In one embodiment, the portion of the dielectric material that is deposited over the first contact level dielectric layer 71 concurrently with deposition of the at least one dielectric support pillar 7P can be present over the first contact level dielectric layer 71 as a second contact level dielectric layer 73. Each of the at least one dielectric support pillar 7P and the second contact level dielectric layer 73 is an optional structure. As such, the second contact level dielectric layer 73 may, or may not, be present over the insulating cap layer 70 and the retro-stepped dielectric material portion 65. The first contact level dielectric layer 71 and the second contact level dielectric layer 73 are herein collectively referred to as at least one contact level dielectric layer (71, 73). In one embodiment, the at least one contact level dielectric layer (71, 73) can include both the first and second contact level dielectric layers (71, 73), and optionally include any additional via level dielectric layer that can be subsequently formed. In another embodiment, the at least one contact level dielectric layer (71, 73) can include only the first contact level dielectric layer 71 or the second contact level dielectric layer 73, and optionally include any additional via level dielectric layer that can be subsequently formed. Alternatively, formation of the first and second contact level dielectric layers (71, 73) may be omitted, and at least one via level dielectric layer may be subsequently formed, i.e., after formation of a backside contact via structure.

The second contact level dielectric layer 73 and the at least one dielectric support pillar 7P can be formed as a single contiguous structure of integral construction, i.e., without any material interface therebetween. In another embodiment, the portion of the dielectric material that is deposited over the first contact level dielectric layer 71 concurrently with deposition of the at least one dielectric support pillar 7P can be removed, for example, by chemical mechanical planarization or a recess etch. In this case, the second contact level dielectric layer 73 is not present, and the top surface of the first contact level dielectric layer 71 can be physically exposed.

Figure 14:
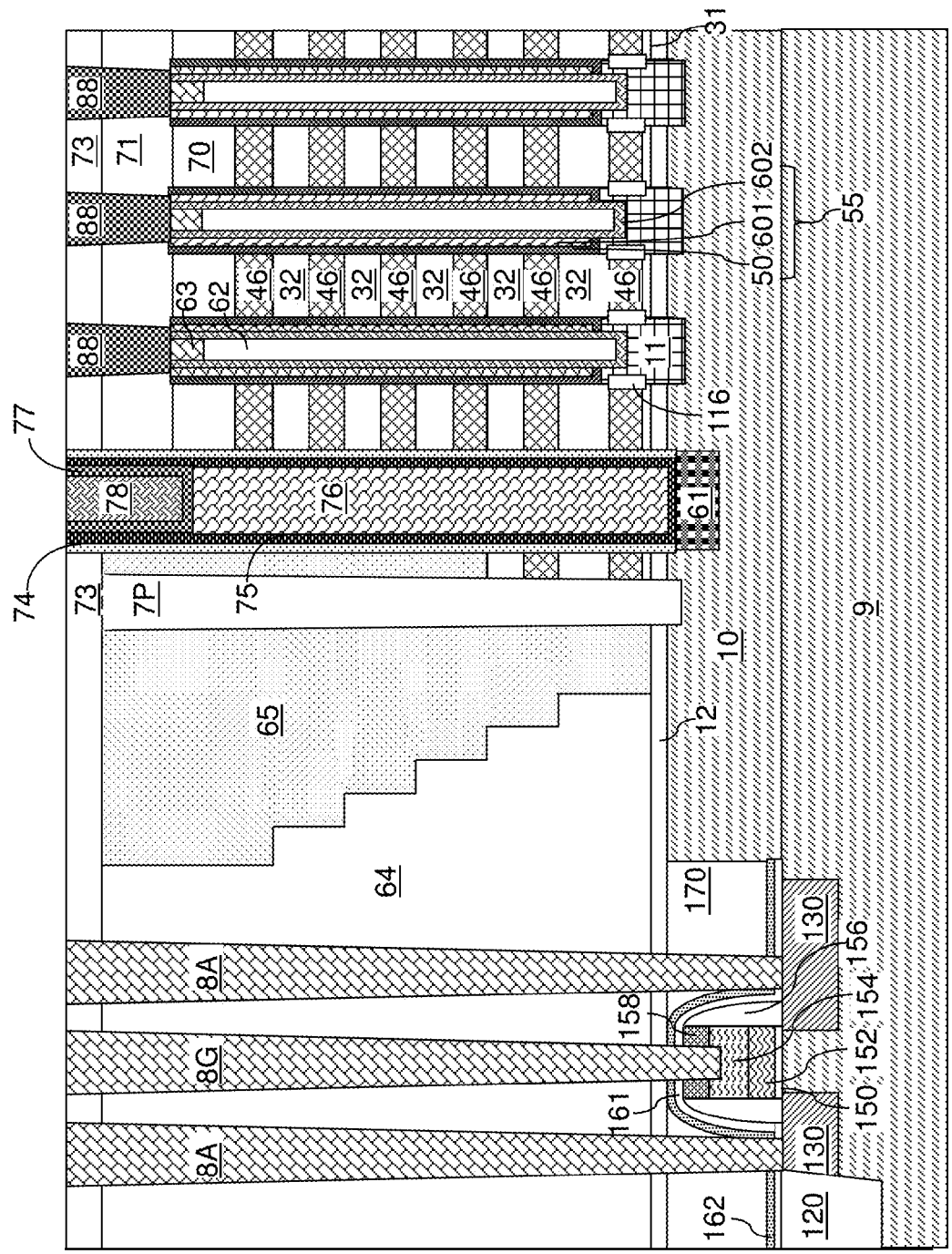
FIG. 14 is a vertical cross-sectional view of the first exemplary structure after formation of device contact via structures according to the first embodiment of the present disclosure.

Optionally, memory contact via structures 88 can be formed through the first and second contact level dielectric layers (73, 71). Alternatively, the memory contact via structures 88 may be formed at a later step together with the via structures 8A and 8G as shown in FIG. 14 and described below. Specifically, a photoresist layer can be applied over the second contact level dielectric layer 73, and can be lithographically patterned to form openings overlying the drain structures 63. An anisotropic etch can be performed to transfer the pattern in the photoresist layer through the first and second contact level dielectric layers (73, 71) to form memory contact via cavities that extend through the first and second contact level dielectric layers (73, 71). The memory contact via cavities can be filled with at least one conductive material. Excess portions of the at least one conductive material can be removed from above a horizontal plane including a top surface of the second contact level dielectric layer 73. Each remaining contiguous portion of the at least one conductive material constitutes a memory contact via structure 88, which contacts a top surface of an underlying drain region 63. The photoresist layer can be subsequently removed, for example, by ashing.

Another photoresist layer (not shown) can be applied over the alternating stack (32, 42) and/or the retro-stepped dielectric material portion 65, and optionally over the and lithographically patterned to form at least one backside contact trench 79 in an area in which formation of a backside contact via structure is desired. The pattern in the photoresist layer can be transferred through the alternating stack (32, 42) and/or the retro-stepped dielectric material portion 65 employing an anisotropic etch to form the at least one backside contact trench 79, which extends at least to the top surface of the substrate (9, 10). In one embodiment, the at least one backside contact trench 79 can include a source contact opening in which a source contact via structure can be subsequently formed.

A source region 61 can be formed in a surface portion of the substrate (e.g., in the semiconductor material layer 10) underneath the backside contact trench 79. A source region 61 can be formed by implanting electrical dopants through each backside contact trench 79 into a semiconductor portion located on, or within, the substrate (9, 10). For example, a source region 61 may be formed by implantation of dopant atoms into a portion of the semiconductor material layer 10 through each backside contact trench 79. Alternatively, a source region 61 can be formed on the substrate (9, 10) as a doped semiconductor portion by deposition of a semiconductor material, for example, by selective epitaxy, and by implantation of electrical dopants into the deposited semiconductor portion.

Figure 6:
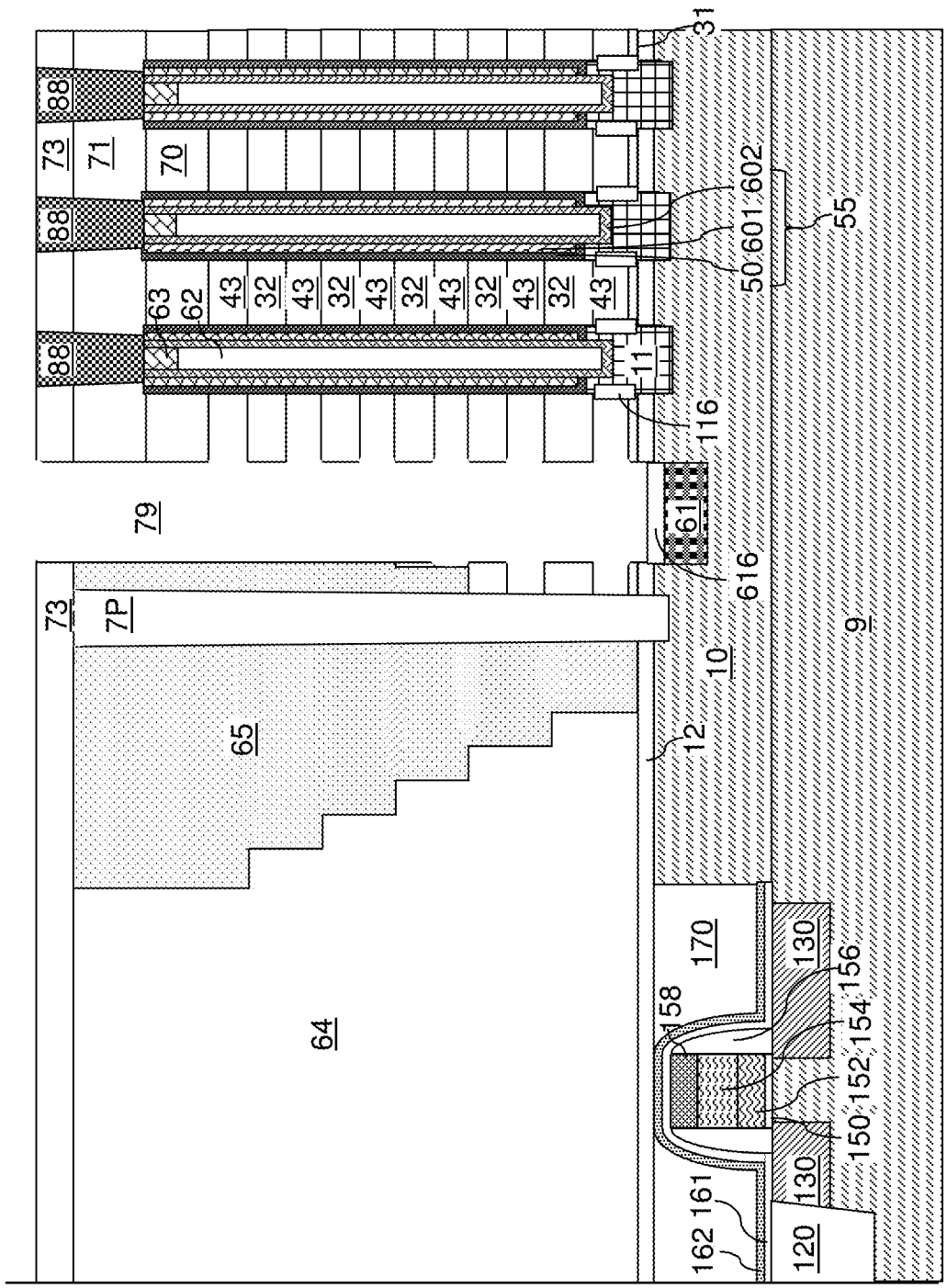
FIG. 6 is a vertical cross-sectional view of the first exemplary structure after formation of backside recesses according to the first embodiment of the present disclosure.

Referring to FIG. 6, an etchant that selectively etches the second material of the sacrificial material layers 42 with respect to the first material of the insulating layers 32 can be introduced into the at least one backside contact trench 79, for example, employing an etch process. Backside recesses 43 are formed in volumes from which the sacrificial material layers 42 are removed. The removal of the second material of the sacrificial material layers 42 can be selective to the first material of the insulating layers 32, the material of the at least one dielectric support pillar 7P, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the at least one dielectric support pillar 7P, and the retro-stepped dielectric material portion 65 can be selected from silicon oxide, silicon nitride, and dielectric metal oxides. In this case, the depth of the at least one backside contact trench 79 can be modified so that the bottommost surface of the at least one backside contact trench 79 is located within the dielectric pad layer 12, i.e., to avoid physical exposure of the top surface of the semiconductor substrate layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside contact trench 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the device region 100 comprises an array of monolithic three-dimensional NAND strings having a plurality of device levels disposed above the substrate (9, 10, 61). In this case, each backside recess 43 can define a space for receiving a respective word line of the array of monolithic three-dimensional NAND strings.

Each of the plurality of backside recesses 43 can extend substantially parallel to the top surface of the substrate (9, 10, 61). A backside recess 43 can be vertically bounded by a top surface of an underlying insulating layer 32 and a bottom surface of an overlying insulating layer 32. In one embodiment, each backside recess 43 can have a uniform height throughout. Optionally, a backside blocking dielectric layer can be formed in the backside recesses.

Physically exposed surface portions of epitaxial channel portions 11 and the source regions 61 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a dielectric spacer 116, and to convert a surface portion of each source region 61 into a sacrificial dielectric portion 616. In one embodiment, each dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The dielectric spacers 116 include a dielectric material that includes the same semiconductor element as the epitaxial channel portions 11 and additionally includes at least one non-metallic element such as oxygen and/or nitrogen such that the material of the dielectric spacers 116 is a dielectric material. In one embodiment, the dielectric spacers 116 can include a dielectric oxide, a dielectric nitride, or a dielectric oxynitride of the semiconductor material of the epitaxial channel portions 11. Likewise, each sacrificial dielectric portion 616 includes a dielectric material that includes the same semiconductor element as the source regions 61 and additionally includes at least one non-metallic element such as oxygen and/or nitrogen such that the material of the sacrificial dielectric portions 616 is a dielectric material. In one embodiment, the sacrificial dielectric portions 616 can include a dielectric oxide, a dielectric nitride, or a dielectric oxynitride of the semiconductor material of the source region 61.

Figure 7:
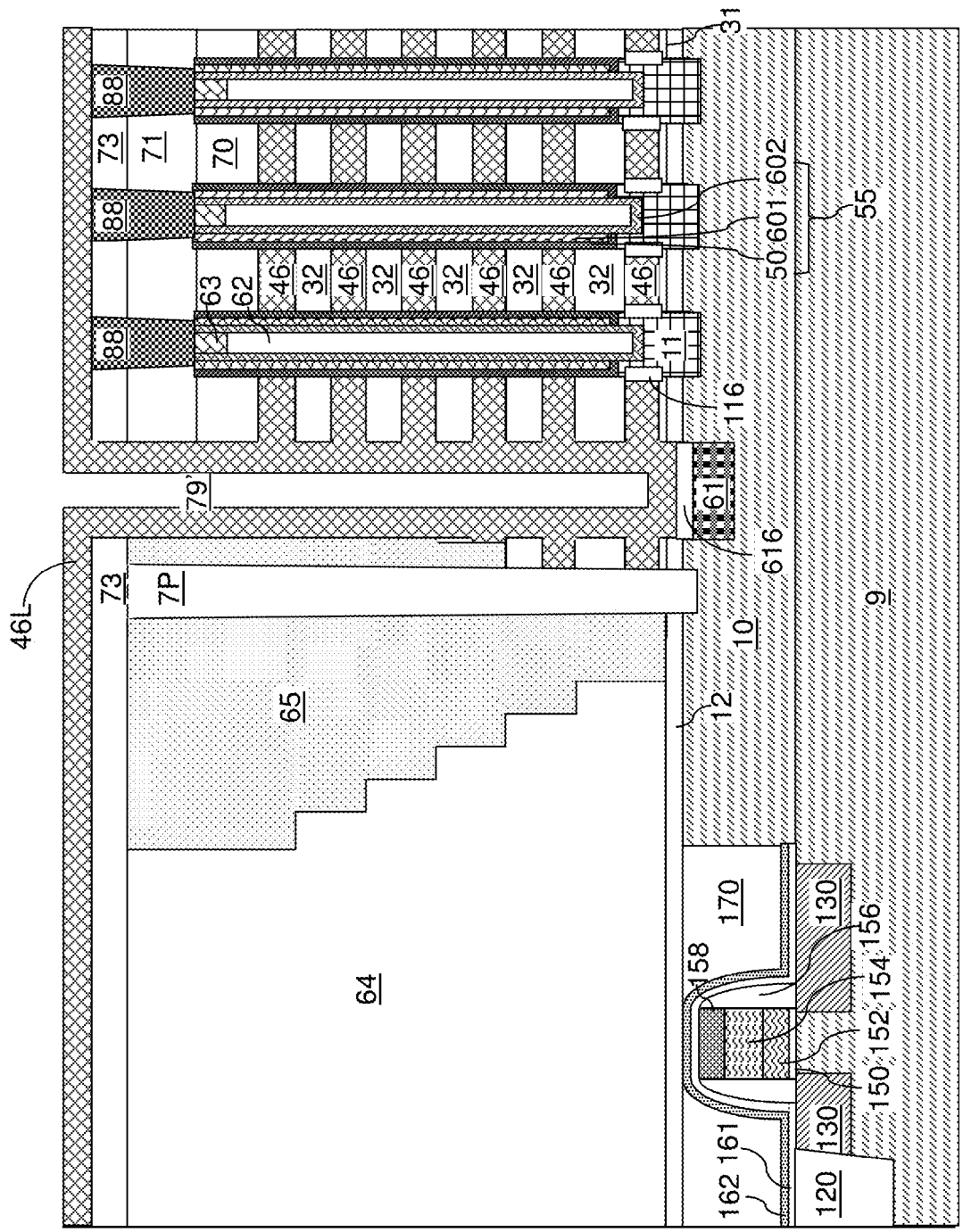
FIG. 7 is a vertical cross-sectional view of the first exemplary structure after formation of electrically conductive layers according to the first embodiment of the present disclosure.

Referring to FIG. 7, a backside blocking dielectric layer (not shown) can be optionally formed. The backside blocking dielectric layer comprises a dielectric material that functions as a control gate dielectric for the control gates to be subsequently formed in the backside recesses 43. In case the at least one blocking dielectric layer (501, 503) is present within each memory opening, the backside blocking dielectric layer 66 is optional. In case the at least one blocking dielectric layer (501, 503) is omitted, the backside blocking dielectric layer is present.

At least one metallic material can be deposited in the plurality of backside recesses 43, on the sidewalls of the at least one the backside contact trench 79, and over the top surface of the second contact level dielectric layer 73. As used herein, a metallic material refers to an electrically conductive material that includes at least one metallic element.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses 43 can be a combination of titanium nitride layer and a tungsten fill material. In one embodiment, the metallic material can be deposited by chemical vapor deposition.

A plurality of electrically conductive layers 46 can be formed in the plurality of backside recesses 43, and a contiguous metallic material layer 46L can be formed on the sidewalls of each backside contact trench 79 and over the at least one contact level dielectric layer (71,73). Thus, each sacrificial material layer 42 can be replaced with an electrically conductive layer 46. A backside cavity 79' is present in the portion of each backside contact trench 79 that is not filled with the backside blocking dielectric layer 66 and the contiguous metallic material layer 46L.

Figure 8:
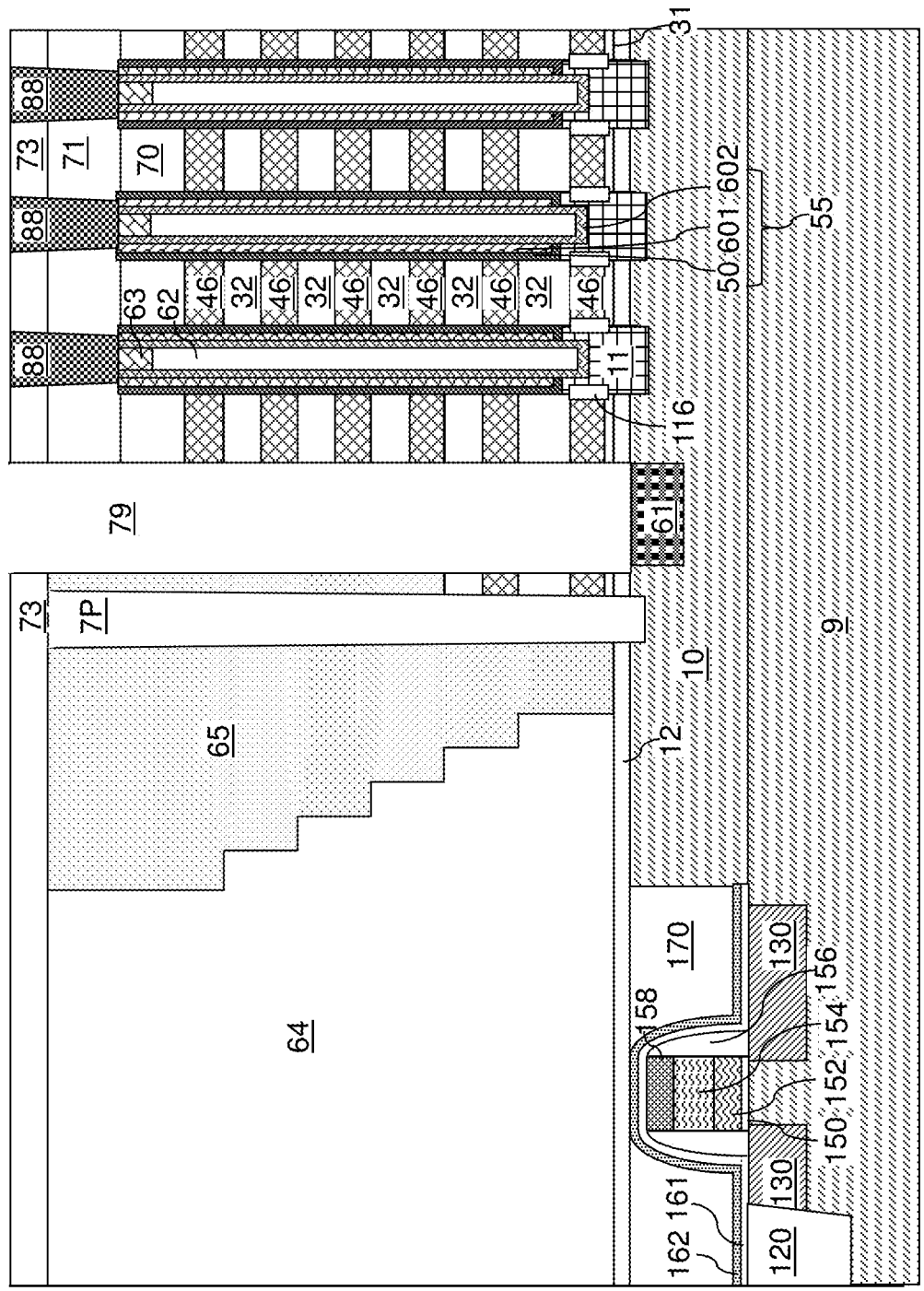
FIG. 8 is a vertical cross-sectional view of the first exemplary structure after removal of a contiguous conductive material layer from inside the backside contact trench according to the first embodiment of the present disclosure.

Referring to FIG. 8, the deposited metallic material of the contiguous metallic material layer 46L is etched back from the sidewalls of each backside contact trench 79 and from above the second contact level dielectric layer 73, for example, by an isotropic etch. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. Optionally, the sacrificial dielectric portions 616 can be removed from above the source regions 61 during the last processing step of the anisotropic etch.

Figure 9:
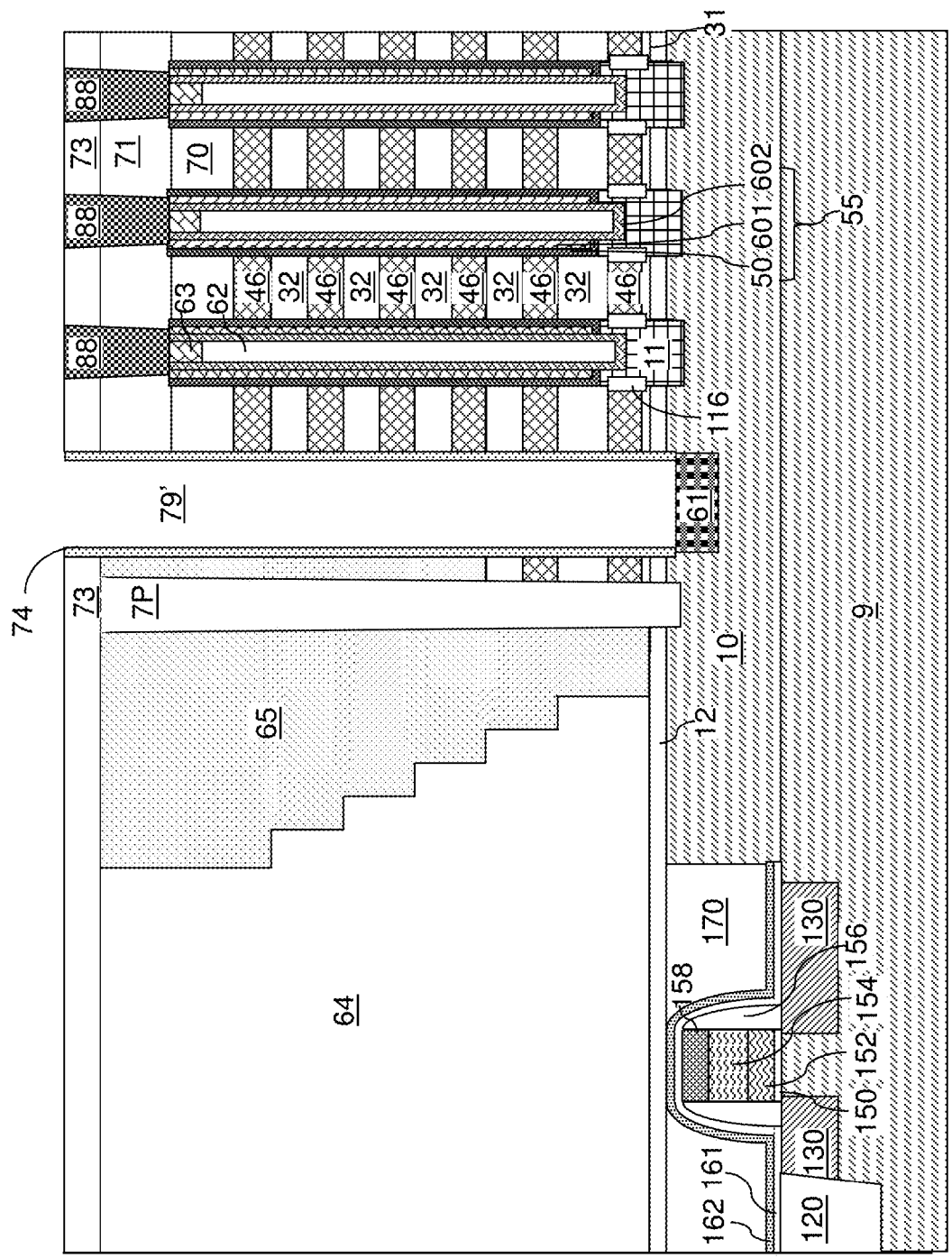
FIG. 9 is a vertical cross-sectional view of the first exemplary structure after formation of an insulating spacer according to the first embodiment of the present disclosure.

Referring to FIG. 9, an insulating material layer can be formed in the at least one backside contact trench 79 and over the second contact level dielectric layer 73 by a conformal deposition process. Exemplary conformal deposition processes include, but are not limited to, chemical vapor deposition and atomic layer deposition. The insulating material layer includes an insulating material such as a dielectric metal oxide (such as aluminum oxide), silicon oxide, silicon nitride, organosilicate glass, nitrogen-doped organosilicate glass, or a combination thereof. The thickness of the insulating material layer can be in a range from 1.5 nm to 60 nm, although lesser and greater thicknesses can also be employed. An anisotropic etch is performed to remove horizontal portions of the insulating material layer. Each remaining portion of the insulating material layer inside a backside contact trench 79 constitutes a vertically elongated annular structure with a cavity therethrough, which is herein referred to as an insulating spacer 74. In one embodiment, an annular bottom surface of the insulating spacer 74 contacts a top surface of the source region 61.

Each insulating spacer 74 can be formed over the sidewalls of the backside contact trench 79, and can be formed directly on the sidewalls of the electrically conductive layers 46 and directly on substantially vertical insulating sidewalls, which can be sidewalls of the insulator layers 32 (in case a backside blocking dielectric layer is not employed) or sidewalls of a backside blocking dielectric layer (in case a backside blocking dielectric layer is employed). The thickness of each insulating spacer 74, as measured at a bottom portion thereof, can be in a range from 1.5 nm to 60 nm, although lesser and greater thicknesses can also be employed. In one embodiment, the thickness of the insulating spacer 74 can be in a range from 3 nm to 10 nm. In one embodiment, each insulating spacer 74 can comprise a dielectric metal oxide (such as aluminum oxide), silicon oxide, silicon nitride, organosilicate glass, nitrogen-doped organosilicate glass, or a combination thereof. An insulating spacer 74 can be formed at a periphery of each backside contact trench 79, while a top surface of a source region 61 is physically exposed underneath a cavity 79' laterally surrounded by the insulating spacer 74.

Figure 10:
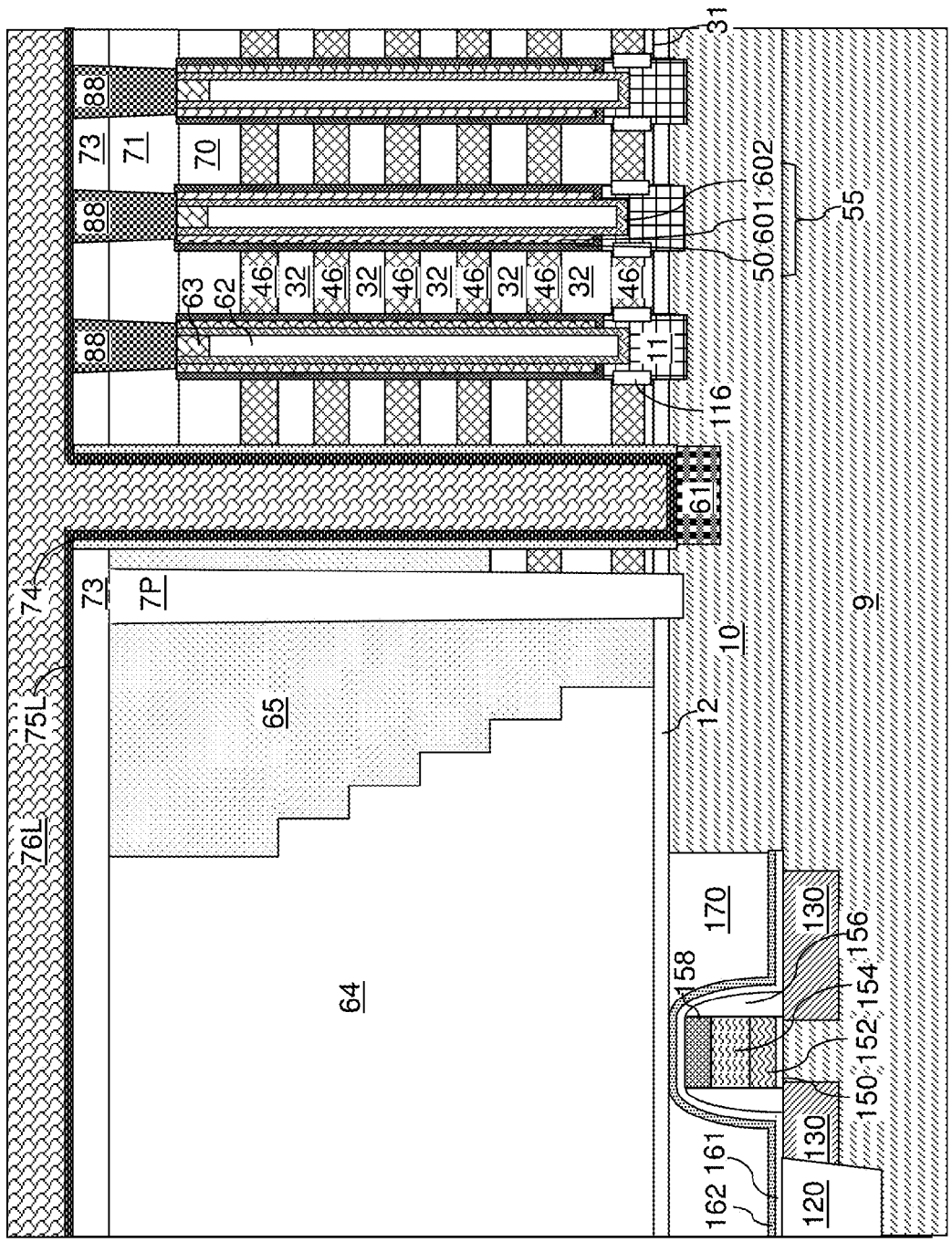
FIG. 10 is a vertical cross-sectional view of the first exemplary structure after deposition of an outer metallic layer and a first conductive material layer according to the first embodiment of the present disclosure.

Referring to FIG. 10, an outer metallic layer 75L is deposited over the sidewalls of the backside contact trench 79. Specifically, the outer metallic layer 75L can be deposited on the sidewalls of the insulating spacer 74 and a topmost layer of the first exemplary structure (such as the second contact level dielectric layer 73). The outer metallic layer 75L can comprise a conductive diffusion barrier material such as a metallic or metallic nitride or the combination thereof. Exemplary metallic liners comprise titanium, cobalt, and ruthenium. Exemplary metallic nitrides comprise titanium nitride, tantalum nitride, and tungsten nitride. The outer metallic layer 75L can be deposited by chemical vapor deposition (CVD) or physical vapor deposition (PVD). The thickness of the outer metallic layer 75L can be in a range from 1 nm to 30 nm, although lesser and greater thicknesses can also be employed.

A first conductive material layer 76L including a first conductive material is deposited in the cavity within the outer metallic layer 75L, i.e., the portion of the backside contact trench 79 that is not filled within the outer metallic layer 75L. The first conductive material layer 76L can be deposited by a conformal deposition process and fill the cavity within the backside contact trench 79. The first conductive material layer 75L can be deposited, for example, by chemical vapor deposition. In one embodiment, the first conductive material layer 76L comprises a heavily doped (e.g., degenerately doped to above about $10^{18}$ cm$^{-3}$) semiconductor material that make it electrically conductive, i.e., having electrical conductivity greater than $1.0 \times 10^5$ S/cm. The doped semiconductor material can be p-doped or n-doped, and can comprise at least one elemental semiconductor material (such as polysilicon), or can comprise a compound semiconductor material (such as a III-V compound semiconductor material or a silicon-germanium alloy). The thickness of the first conductive material layer 76L, as measured at a substantially horizontal portion of the first conductive material layer 76L above the top surface of the second contact level dielectric layer 73, can be selected to be greater than half of the width of the cavity through the insulating spacer 74 so that the cavity can be completely filled. In one embodiment, the semiconductor material may comprise p-type carbon doped silicon, such as carbon and boron doped polysilicon or amorphous silicon. The carbon doping helps to retard void formation in the silicon and to retard any depletion at the top interface of the silicon with a metallic material. The carbon doping content in the silicon may be above $10^{14}$ cm$^{-3}$, such as between about $10^{15}$ cm$^{-3}$ and $10^{21}$ cm$^{-3}$.

Figure 11:
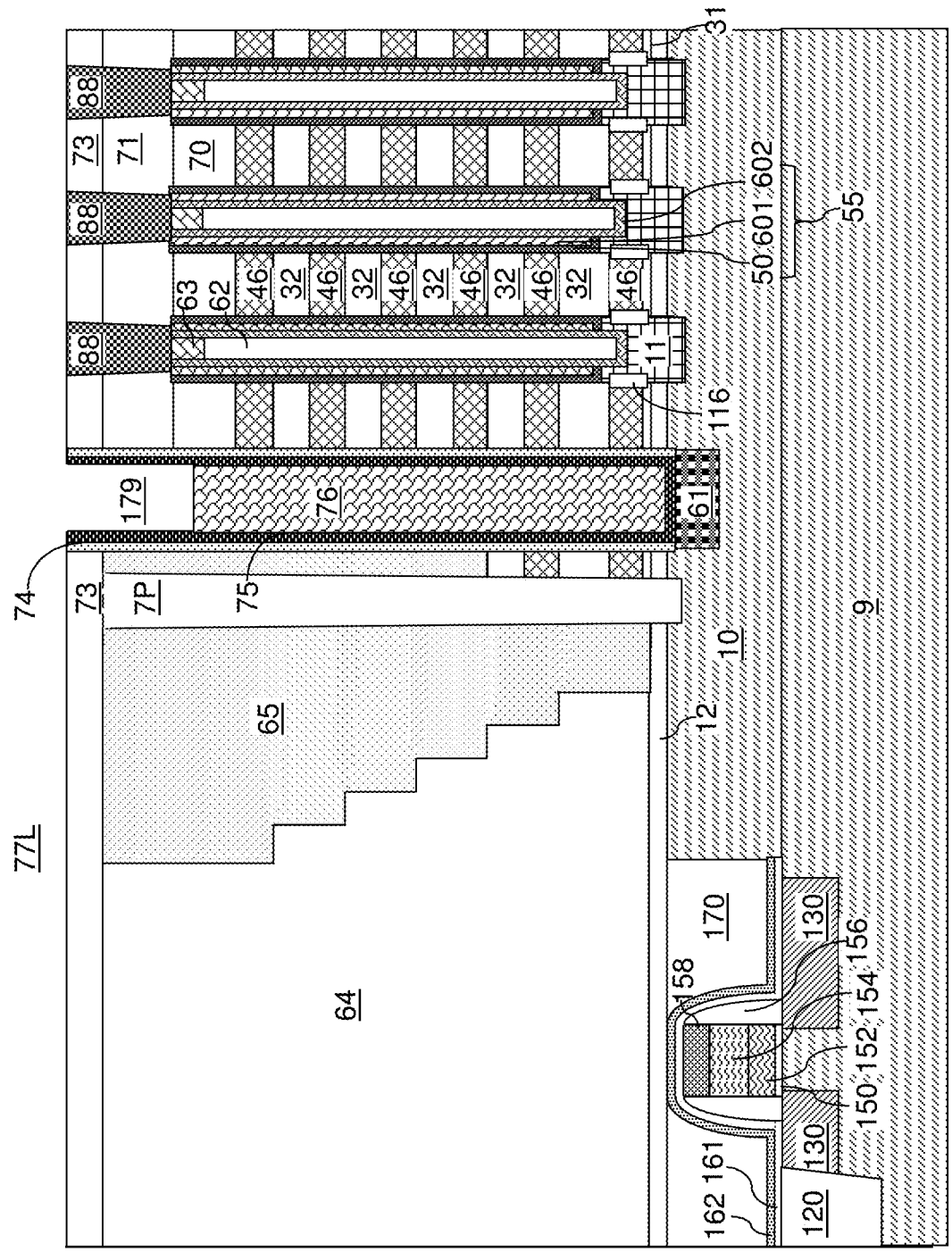
FIG. 11 is a vertical cross-sectional view of the first exemplary structure after formation of a lower conductive material portion according to the first embodiment of the present disclosure.

Referring to FIG. 11, a recess etch is performed to remove the horizontal portion of the first conductive material layer 76L from above the second contact level dielectric layer, and to remove another portion of the first conductive material layer 76L from an upper region of the backside contact trench 79. The recess etch may be an anisotropic etch or an isotropic etch. In one embodiment, the recess etch can remove the first conductive material of the first conductive material layer 76L selective to the metallic material of the outer metallic layer 75L. Optionally, the horizontal portion of the outer metallic layer 75L above the top surface of the second contact level dielectric layer 73 can be removed by an anisotropic etch. The outer metallic layer 75 after removal of the horizontal portion can contact the entirety of the inner sidewall of the insulating spacer 74.

Thus, a portion of the first conductive material within the backside contact trench 79 is recessed to form a cavity 179.

A remaining portion of the first conductive material located under the cavity 179 and within the backside contact trench 79 constitutes a lower conductive material portion 76 that comprises the first conductive material. The upper surface of the lower conductive material portion 76 may be planar or curved, depending on the type of etch used (e.g., anisotropic vs. isotropic). As used herein, the top surface of the lower conductive material portion 76 is referred to as a substantially horizontal surface which may be quasi-horizontal if the surface is curved or exactly horizontal if the surface is planar. It should be noted that the top surface of the lower conductive material portion 76 does not have to be perpendicular to the direction of gravity to be "horizontal" if the top surface of the substrate is held at a non-zero angle with respect to the direction of gravity. In one embodiment, the height of the lower conductive material portion 76 can be in a range from 50% to 98% of the depth of the backside contact trench 79, and the height of the cavity 179 can be in a range from 2% to 50% of the depth of the backside contact trench 79. In one embodiment, the outer metallic layer 75 extends above the top surface of the lower conductive material portion 79. In one embodiment, inner sidewalls of the outer metallic layer 75 are physically exposed to the cavity 179.

Figure 12:
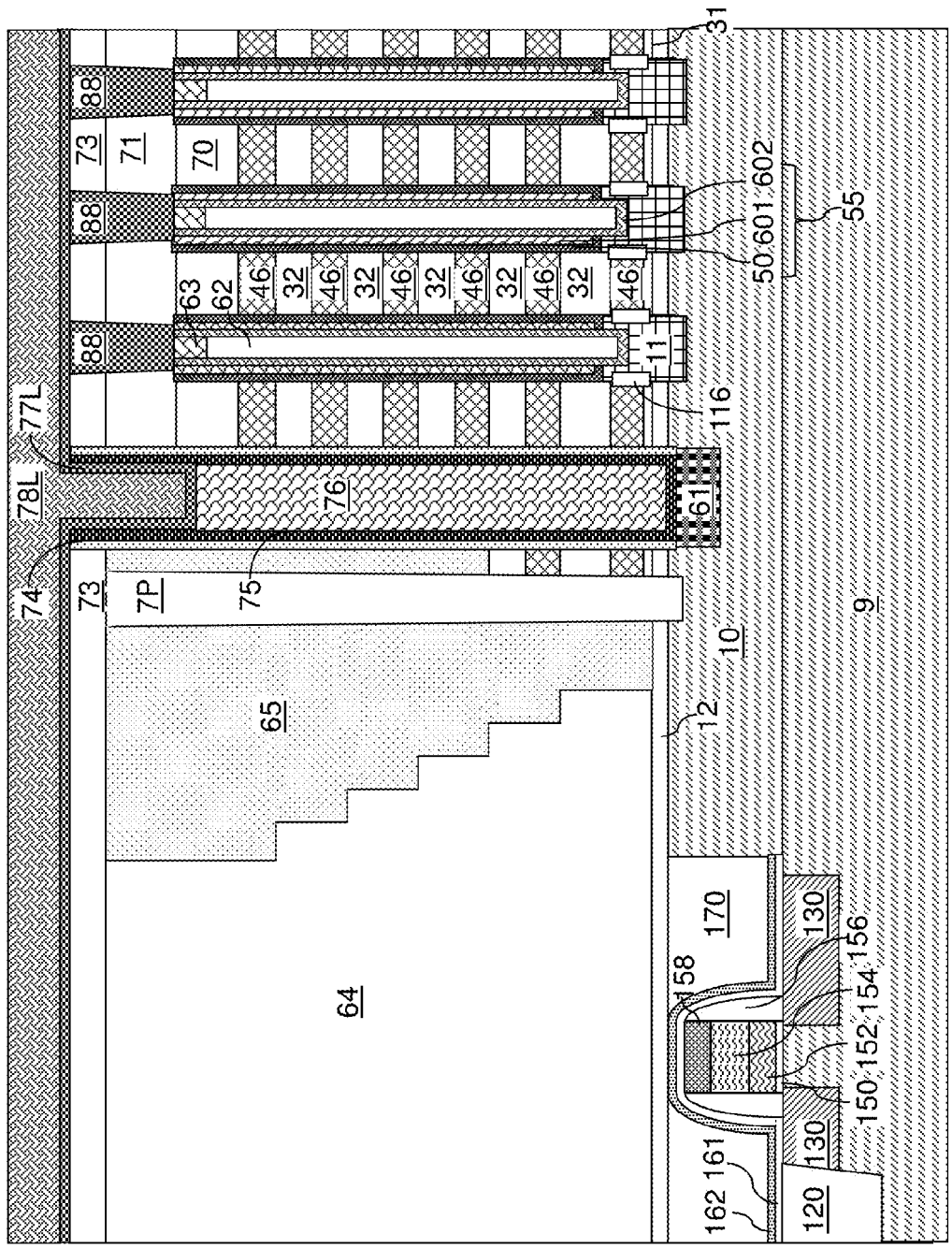
FIG. 12 is a vertical cross-sectional view of the first exemplary structure after formation of an inner conductive layer and a second conductive material layer according to the first embodiment of the present disclosure.

Referring to FIG. 12, an inner metallic layer 77L is deposited on the top surface of the lower conductive material portion 76 and in a peripheral portion of the cavity 179. The inner metallic layer 77L can be formed on the physically exposed surfaces of the outer metallic layer 75 and a topmost dielectric layer (such as the second contact level dielectric layer 73) of the first exemplary structure. In one embodiment, the inner metallic layer 77L contacts the portion of the inner sidewalls of the outer metallic layer 75 within the backside contact trench 79 and above the top surface of the lower conductive material portion 76. The inner metallic layer 77L can comprise a conductive diffusion barrier material such as a metallic (preferably titanium) or metallic nitride (preferably titanium nitride) or the combination thereof. Any conductive material that can be employed for the outer metallic layer 75 can be employed for the inner metallic layer 77L. The inner metallic layer 77L may comprise the same material as, or may comprise a material different from, the outer metallic layer 75. The thickness of the inner metallic layer 77L can be in a range from 1 nm to 30 nm, although lesser and greater thicknesses can also be employed.

A second conductive material layer 78L including a second conductive material is deposited in the cavity within the sidewalls of the inner metallic layer 77L, i.e., the portion of the backside contact trench 79 that is not filled within the outer metallic layer 75, the lower conductive material portion 76, and the inner metallic layer 77L. The second conductive material layer 78L can be deposited by a conformal deposition process and fill the cavity within the backside contact trench 79. The conductive material layer can be deposited, for example, by chemical vapor deposition or physical vapor deposition.

In one embodiment, the second conductive material layer 78L comprises a metallic fill material. The metallic fill material comprises at least one metal element such as tungsten, ruthenium, cobalt, titanium, aluminum, or a combination thereof. In one embodiment, the metallic fill material 78L comprises tungsten deposited by chemical vapor deposition or atomic layer deposition. The second conductive material layer 78L can completely fill the cavity within the backside contact trench 79. Preferably, the metallic fill material 78L is more electrically conductive than the heavily doped semiconductor material of the lower conductive material portion 76. For example, tungsten material of layer 78L is typically under tensile stress in the device. To counteract the stress imposed by the tungsten layer 78L on the substrate, the heavily doped semiconductor material of the lower conductive material portion 76 is preferably under an opposite (e.g., compressive or neutral stress with substrate) stress. The neutral stress material i.e., same type of material (ex. poly or crystalline silicon) as substrate, so that the net stress can be reduced compared to the tensile stress metallic material (ex. tungsten) fully filled in the source line trench 79'.

Figure 13:
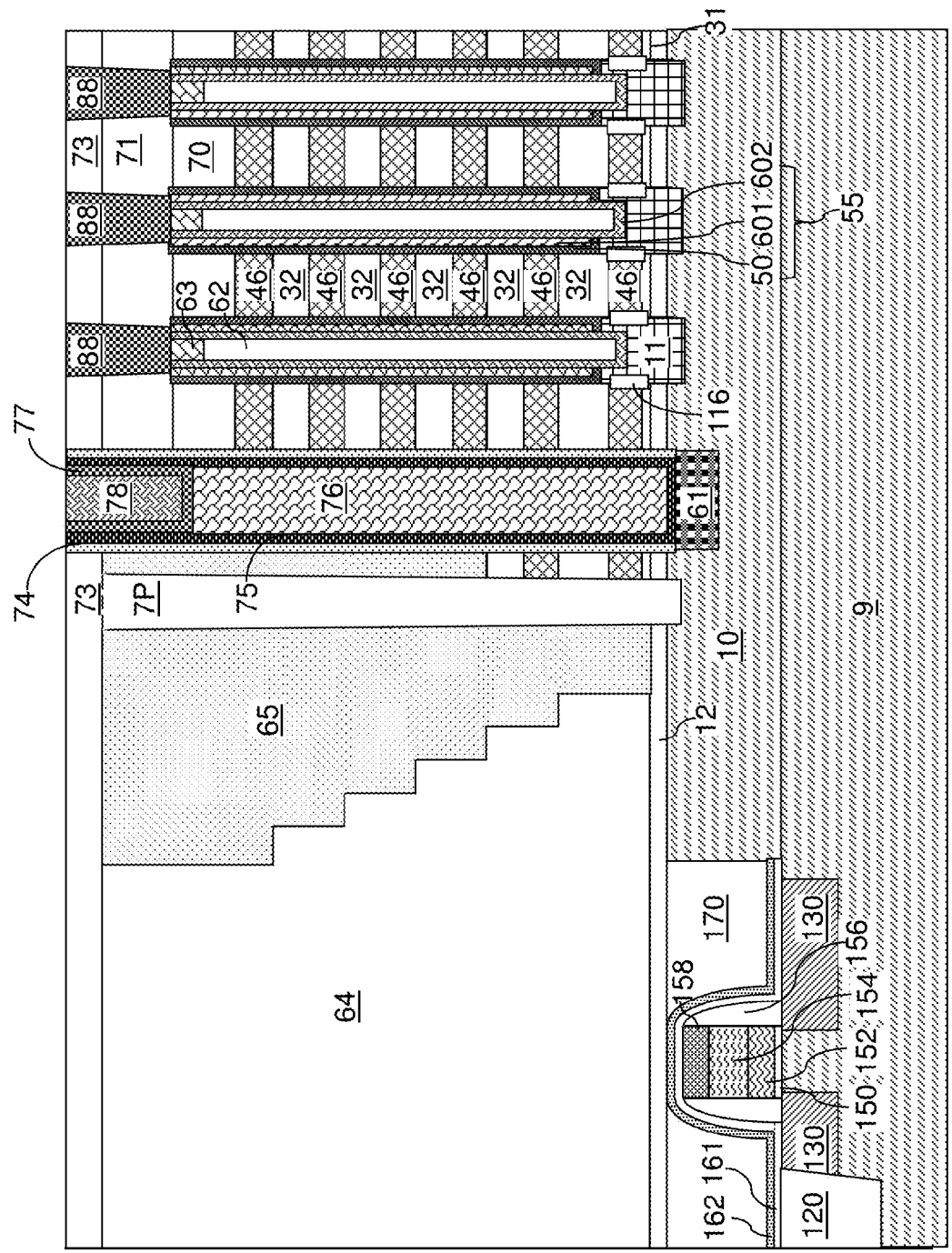
FIG. 13 is a vertical cross-sectional view of the first exemplary structure after planarization and formation of an upper conductive portion according to the first embodiment of the present disclosure.

Referring to FIG. 13, the portions of the second conductive material layer 78L and the inner metallic layer 77L located above the top surface of the topmost dielectric layer of the first exemplary structure (such as the second contact level dielectric layer 73) can be removed by a planarization process such as a recess etch, chemical mechanical planarization, or a combination thereof. Horizontal portions of the second conductive material and the outer metallic layer 77L can be removed by a planarization process that employs the second contact level dielectric layer 73 as a stopping layer. The inner metallic layer 77 after the planarization (i.e., the remaining portion of the inner metallic liner 77L after the planarization) includes a substantially horizontal portion contacting a top surface of the lower conductive material portion and a vertical portion contacting sidewalls of the outer metallic layer 75. The remaining portion of the second conductive material layer 78L constitutes an upper conductive material portion 78 that comprises the metallic fill material.

The combination of the lower conductive material portion 76, the upper conductive material portion 78, the inner metallic layer 75, and the outer metallic layer 77 (i.e., barrier layers 75, 77) together form a NAND device source electrode (which is also referred to herein as a source electrode contact via structure) which contacts the source region 61. Preferably, the combination of the two barrier layers 75, 77 adjacent to the upper conductive material portion 78 is thicker than the single barrier layer 75 adjacent to the lower conductive material portion 76.

Referring to FIG. 14, contact via cavities can be formed through the second contact level dielectric layer 73 and the dielectric material portion 64 to various nodes of peripheral devices by applying and patterning a photoresist layer over the first exemplary structure, and by anisotropically etching the second contact level dielectric layer 73, the dielectric material portion 64, and underlying structures. The contact via cavities can be filled with a conductive material to form various contact via structures (8G, 8A), which may include, for example, a gate contact via structure 8G and an active region contact via structure 8A. In an alternative embodiment, the memory contact via structures 88 can be formed through the first and second contact level dielectric layers (73, 71) to the drain regions 63 at the same time as the other contact via structures (8A, 8G) during the same metallic material deposition step rather than during the earlier step shown in FIG. 5A. Furthermore, the word line contact via structures (not shown for clarity) to the word lines 46 may also be formed in region 300 during the same or different formation step.

Figure 15:
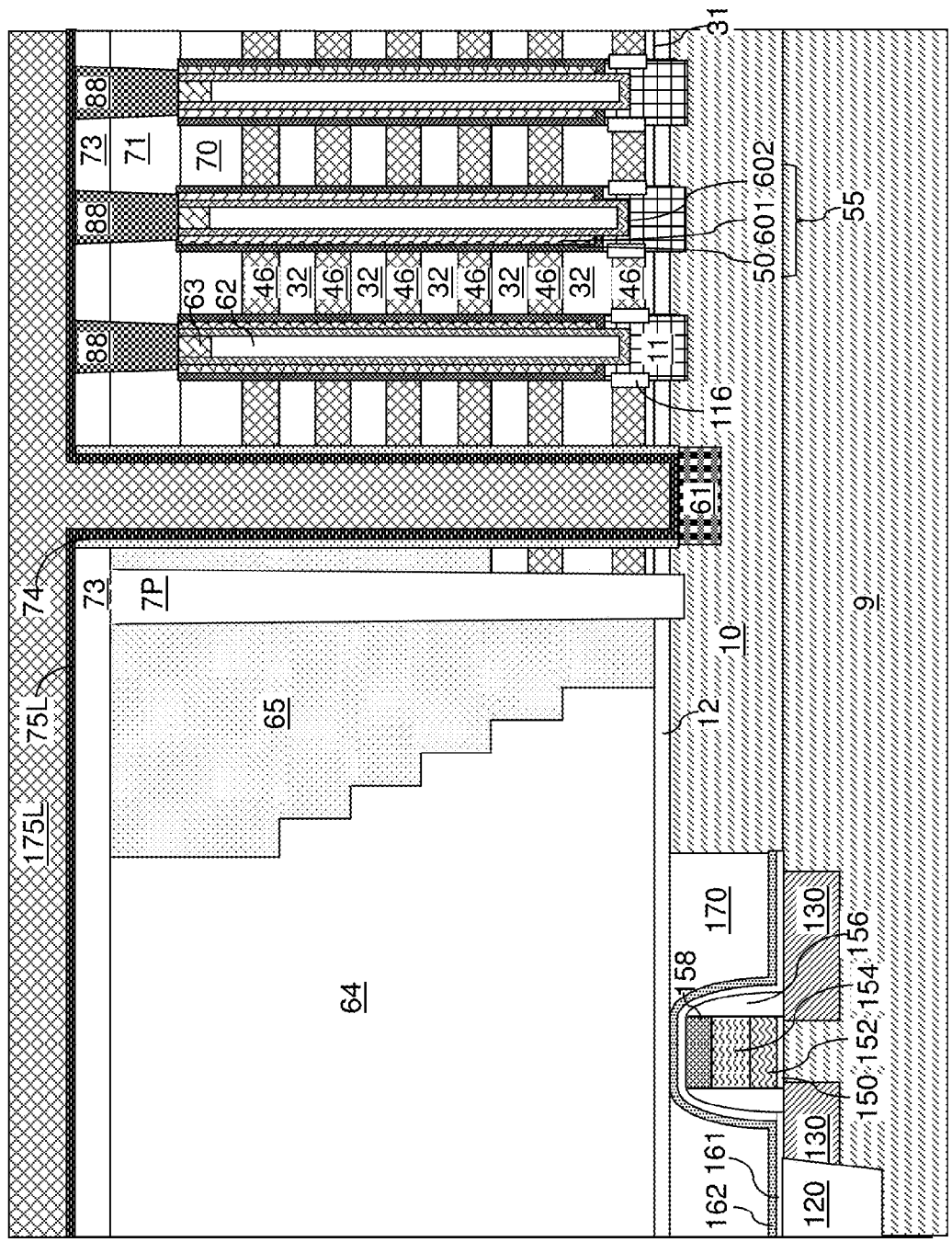
FIG. 15 is a vertical cross-sectional view of a second exemplary structure after formation of an outer metallic layer and a first conductive material layer according to a second embodiment of the present disclosure.
Figure 16:
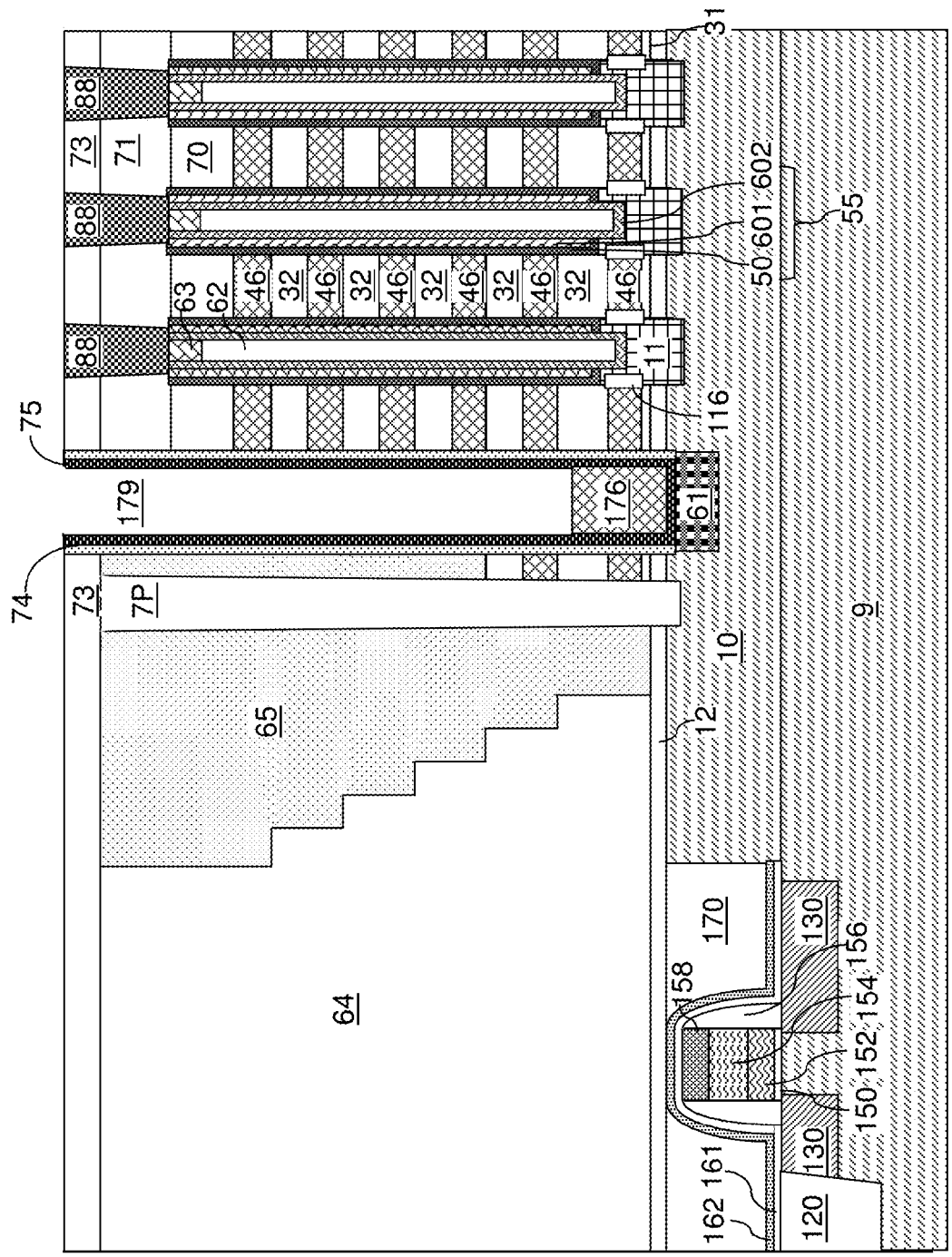
FIG. 16 is a vertical cross-sectional view of the second exemplary structure after formation of a lower conductive material portion according to the second embodiment of the present disclosure.

Referring to FIG. 15, a second exemplary structure according to a second embodiment of the present disclosure can be derived from the first exemplary structure of FIG. 9 by depositing an outer metallic layer 75L in the same manner as in the first embodiment, and by subsequently depositing a first conductive material layer 176L including a first conductive material in the cavity within the outer metallic layer 75L. The first conductive material layer 176L can be deposited by a conformal deposition process and fill the cavity within the backside contact trench 79. The first conductive material layer 176L comprises a metallic fill material. In one embodiment, the first conductive material layer 176L comprises at least one metal element such as tungsten, ruthenium, cobalt, titanium aluminum, or a combination thereof. In one embodiment, the first conductive material layer 176L comprises tungsten deposited by chemical vapor deposition or atomic layer deposition. The first conductive material layer 176L can completely fill the cavity within the backside contact trench 79. The thickness of the first conductive material layer 176L, as measured at a substantially horizontal portion of the first conductive material layer 176L above the top surface of the second contact level dielectric layer 73, can be selected to be greater than half of the width of the cavity through the insulating spacer 74 so that the cavity can be completely filled.

A recess etch is performed to remove the horizontal portion of the first conductive material layer 176L from above the second contact level dielectric layer, and to remove another portion of the first conductive material layer 176L from an upper region of the backside contact trench 79. The recess etch may be an anisotropic etch or an isotropic etch. In one embodiment, the recess etch can remove the first conductive material of the first conductive material layer 176L selective to the metallic material of the outer metallic layer 75L. Optionally, the horizontal portion of the outer metallic layer 75L above the top surface of the second contact level dielectric layer 73 can be removed by an anisotropic etch. The outer metallic layer 75 after removal of the horizontal portion can contact the entirety of the inner sidewall of the insulating spacer 74.

Thus, a portion of the first conductive material within the backside contact trench 79 is recessed to form a cavity 179. A remaining portion of the first conductive material located under the cavity 179 and within the backside contact trench 19 constitutes a lower conductive material portion 176 that comprises the first conductive material. In one embodiment, the height of the lower conductive material portion 176 can be in a range from 2% to 50% of the depth of the backside contact trench 79, and the height of the cavity 179 can be in a range from 98% to 50% of the depth of the backside contact trench 79. In one embodiment, the outer metallic layer 75 extends above the top surface of the lower conductive material portion 79. In one embodiment, inner sidewalls of the outer metallic layer 75 are physically exposed to the cavity 179.

Figure 17:
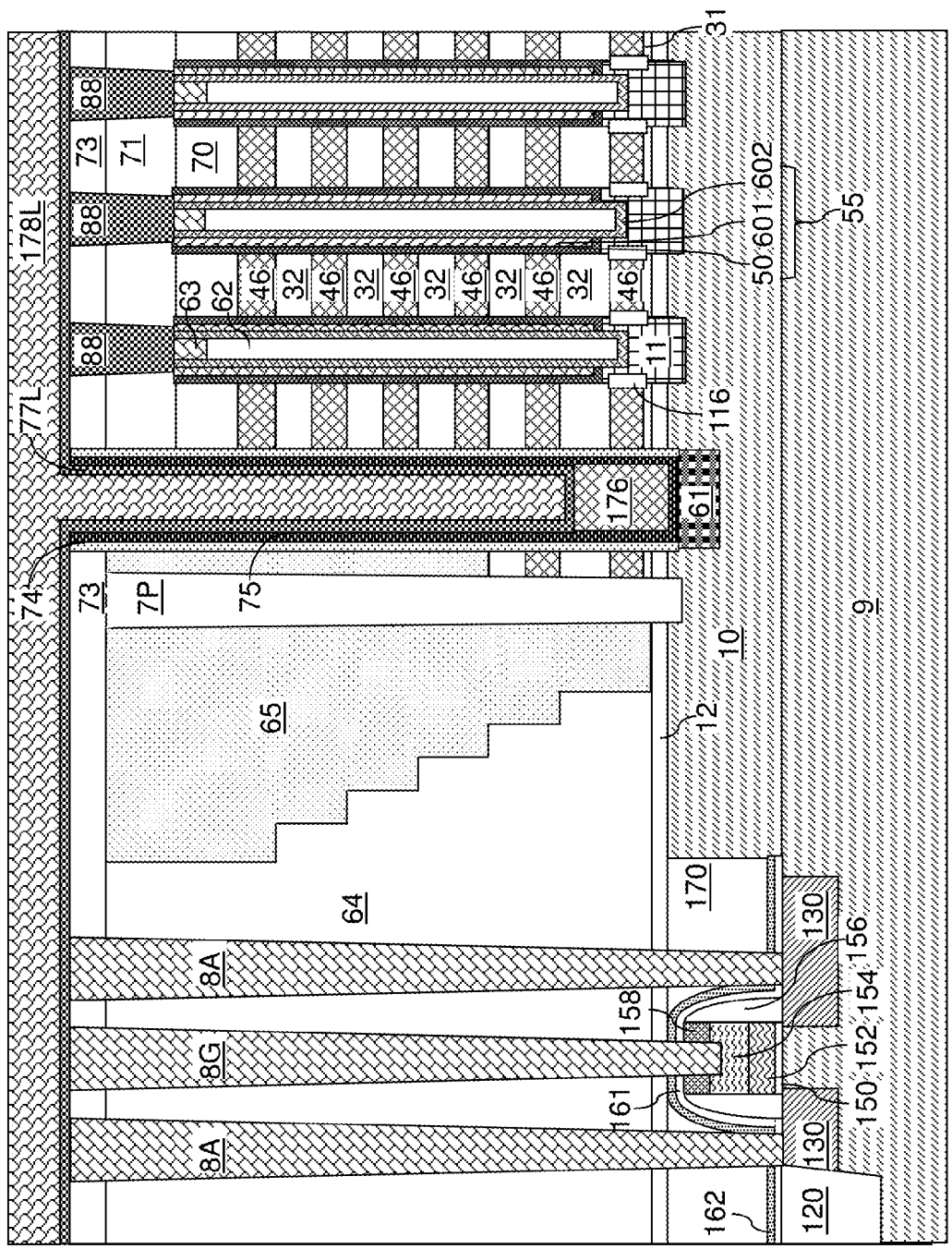
FIG. 17 is a vertical cross-sectional view of the second exemplary structure after formation of an inner conductive layer and a second conductive material layer according to the second embodiment of the present disclosure.

Referring to FIG. 17, an inner metallic layer 77L is deposited on the top surface of the lower conductive material portion 176 and in a peripheral portion of the cavity 179 in the same manner as in the first embodiment. The inner metallic layer 77L can comprise the same material as, and can have the same thickness as, in the first embodiment.

A second conductive material layer 178L including a second conductive material is deposited in the cavity within the sidewalls of the inner metallic layer 77L. The second conductive material layer 178L can be deposited by a conformal deposition process and fill the cavity 179 within the backside contact trench 79. The second conductive material layer 178L comprises a conductive doped semiconductor material, i.e., a heavily doped semiconductor material having electrical conductivity greater than $1.0 \times 10^5$ S/cm. The doped semiconductor material can be p-doped or n-doped, and can comprise at least one elemental semiconductor material (such as polysilicon), or can comprise a compound semiconductor material (such as a III-V compound semiconductor material or a silicon-germanium alloy), as described with respect to the first embodiment above. For example, the second conductive material layer 178L may comprise boron doped or carbon and boron doped silicon, such as amorphous silicon or polysilicon. The second conductive material layer 178L completely fills the cavity.

Figure 18:
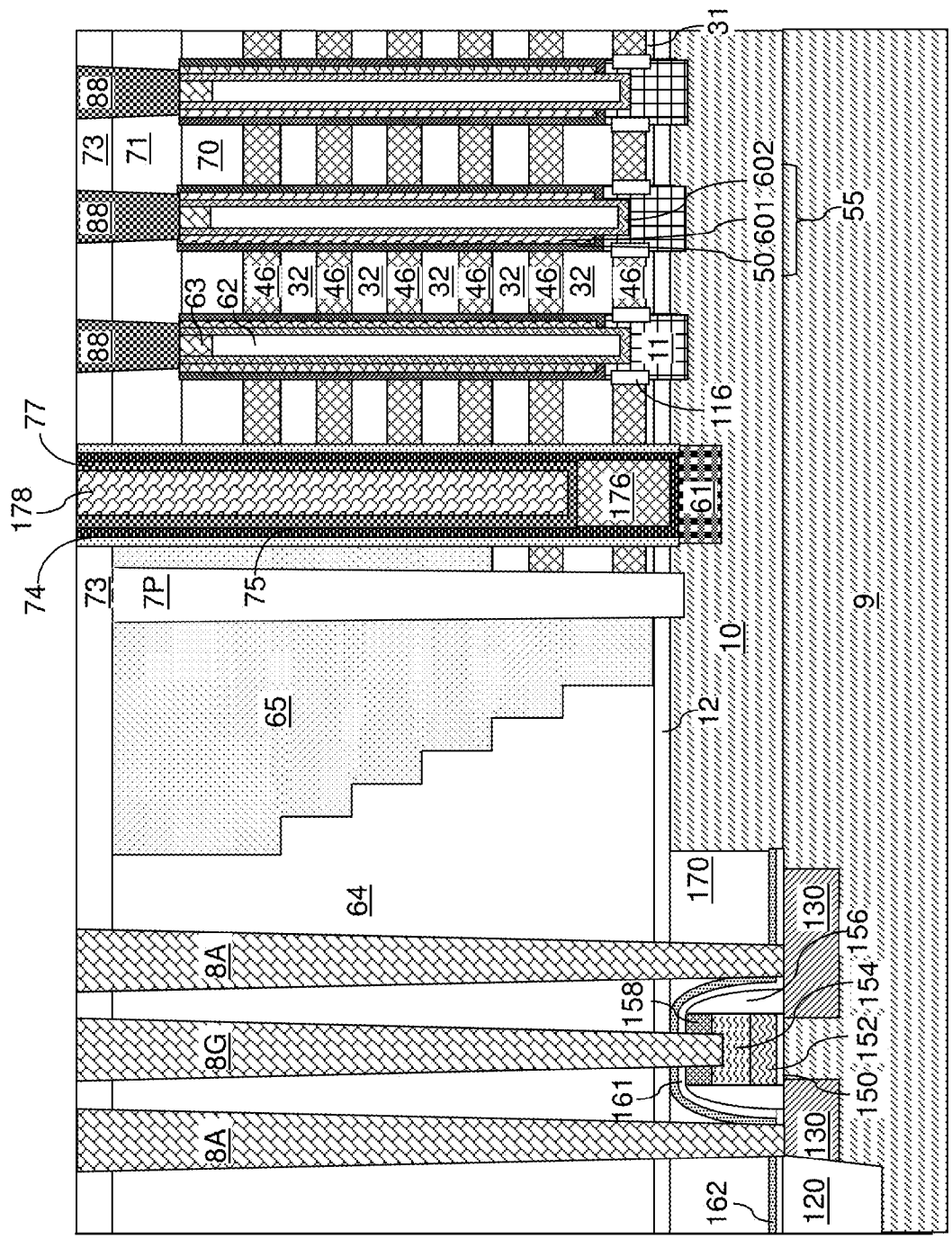
FIG. 18 is a vertical cross-sectional view of the second exemplary structure after formation of a backside contact via structure and device contact via structures according to the second embodiment of the present disclosure.

Referring to FIG. 18, the portions of the second conductive material layer 178L and the inner metallic layer 77L located above the top surface of the topmost dielectric layer of the second exemplary structure (such as the second contact level dielectric layer 73) can be removed by a dry etch back process such as a recess etch, chemical mechanical planarization, or a combination thereof. The inner metallic layer 77 after the planarization (i.e., the remaining portion of the inner metallic liner 77L after the planarization) includes a substantially horizontal portion contacting a top surface of the lower conductive material portion and a vertical portion contacting sidewalls of the outer metallic layer 75. The remaining portion of the second conductive material layer 178L constitutes an upper conductive material portion 178 that comprises a conductive doped semiconductor material. Preferably, the upper conductive material portion 178 is less electrically conductive and is under an opposite stress, than the lower conductive material portion 176.

Figure 19A:
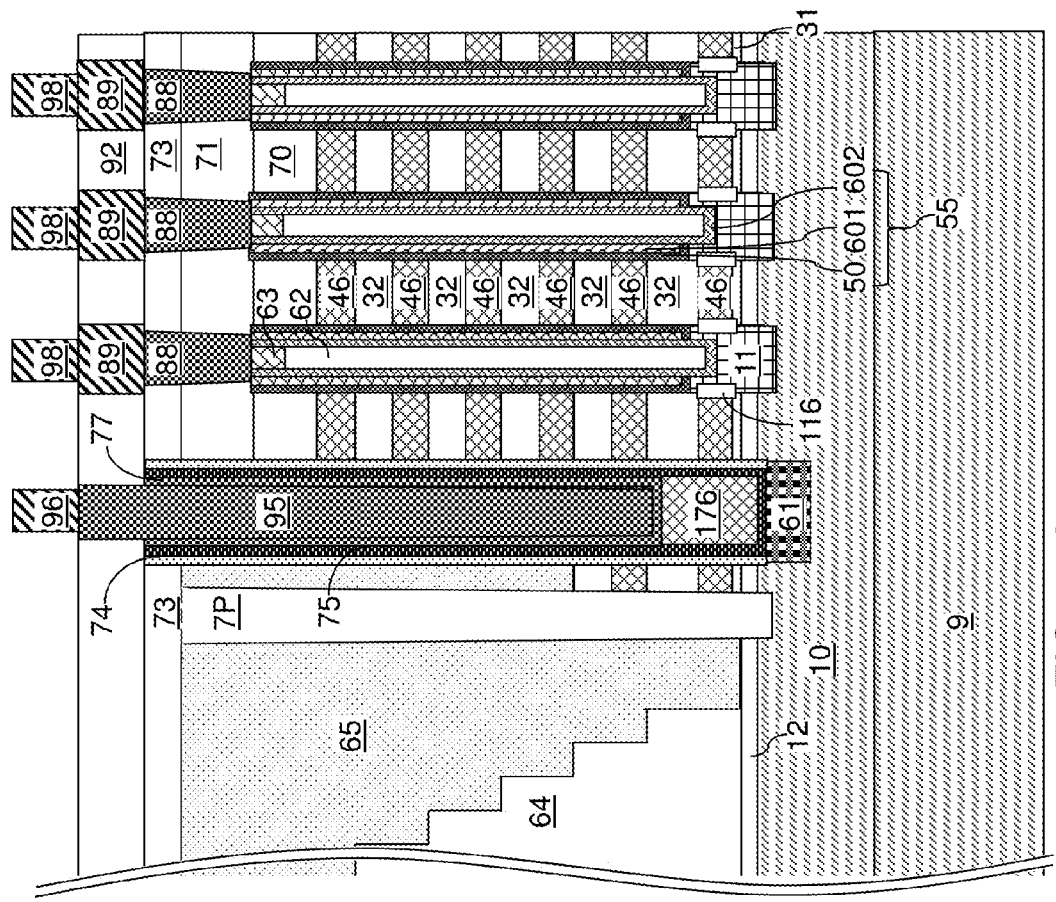
FIG. 19A is a vertical cross-sectional view of the second exemplary structure after formation of the bit lines and shunt lines according to the second embodiment of the present disclosure.

Various contact via structures (8G, 8A, optionally 88, word line contact via structures, etc.) can be formed as in the first embodiment. In this embodiment, the contact via structure (75, 77, 176, 178) to the source electrode 61 preferably extends to at least one of the substantially horizontal portion of the inner barrier layer 77 or the metallic lower conductive material portion 176. For example, as shown in FIGS. 19A and 19B, the source electrode lower level interconnects may comprise pillar shaped interconnects 95, such as cylindrical pillar shaped interconnects, which extend through the heavily doped semiconductor upper conductive material portion 178 to at least one of the substantially horizontal portion of the inner barrier layer 77 or the metallic lower conductive material portion 176 in the trenches 79. The source electrode lower level interconnect(s) 95 may comprise any metallic material, such as tungsten, tungsten nitride, titanium, titanium nitride, tantalum, tantalum nitride, cobalt, and ruthenium. This improves the contact resistance between the source electrode lower level interconnect(s) 95 and the metallic material 77, 176 in the source electrodes.

An upper level dielectric material layer 92 can be formed over the top surface of the dielectric material layer 73. The dielectric material of layer 92 can be, for example, silicon oxide, silicon nitride, organosilicate glass, or a combination thereof. Upper level interconnects can be formed in the upper level dielectric material layer 92, for example, by forming openings and filling them with at least one conductive material. Excess portions of the at least one conductive material can be removed from above the top surface of the upper level dielectric material layer 92, for example, by chemical mechanical planarization. Memory interconnect structures 89 may be formed in the openings in layer 92 in contact with contact via structures 88. In one embodiment, the source electrode lower level interconnects 95 may be formed at the same time as the other contact via structures (e.g., 8A, 8G, 88 and the word line contact via structures). In this case, an upper source electrode interconnect structure may be formed in contact with each source electrode lower level interconnect 95 through layer 92. Alternatively, the source electrode lower level interconnects 95 may be formed at the same time the memory interconnect structures 89 such that the source electrode lower level interconnects 95 extend to the top of layer 92.

Shunt lines 96 and bit lines 98 are then formed over the device. The shunt lines 96 may electrically contact source electrode lower level interconnects 95 (either directly or through a source electrode interconnect structure). Alternatively, separate source lines may contact the source electrode lower level interconnects 95 located in the shunt line region. The bit lines 98 extend parallel to the shunt lines 96 and perpendicular to the length of the trenches 79. The bit lines 98 contact the memory interconnect structures 89, as shown in FIG. 19B.

Each of the first and second exemplary structures can comprise a monolithic three-dimensional memory device. The monolithic three-dimensional memory device can comprise a stack of alternating layers comprising insulating layers 32 and electrically conductive layers 46 and located over a substrate (9, 10, 61), a memory stack structures 55 extending through the stack and including a semiconductor channel (601, 602), a trench (i.e., a backside contact trench 79) vertically extending through the stack, and a contact via structure (75, 76, 77, 78) located in the trench, electrically connected to an end of the semiconductor channel (601, 602), and comprising a vertical stack of a lower conductive material portion (76 or 176) and an upper conductive material portion (78 or 178). One of the lower conductive material portion 76 and the upper conductive material portion 178 comprises a doped semiconductor material portion, and another of the lower conductive material portion 176 and the upper conductive material portion 78 comprises a metallic fill material portion. The lower conductive material portion (76, 176) and the upper conductive material portion (78, 178) are vertically spaced from each other by a substantially horizontal portion of an inner metallic layer (e.g., barrier layer) 77.

In one embodiment, an outer metallic layer 75 laterally surrounds the inner metallic layer 77 and contacts an outer sidewall of the inner metallic layer 77. In one embodiment, the outer metallic layer 75 contacts a bottom surface of the lower conductive material portion (76, 176). The monolithic three-dimensional memory device can comprise a source region 61 located within the substrate (9, 10, 61) and contacting the outer metallic layer 75. In one embodiment, each surface of the lower conductive material portion (76, 176) contacts a surface selected from a sidewalls of the outer metallic layer 75, a top surface of a substantially horizontal portion of the outer metallic layer 75, and a bottom surface of a substantially horizontal portion of the inner metallic layer 77. The inner metallic layer 77 encloses the bottom and sides of the upper conductive material portions 78, 178.

In one embodiment, the inner metallic layer 77 and the outer metallic layer 75 have topmost surfaces located within a first substantially horizontal plane that includes a top surface of a dielectric layer, which can be, for example, the second contact level dielectric layer 73. In one embodiment, the dielectric layer having a top surface included in the first horizontal plane can overlie a plurality of memory stack structures 55. In one embodiment, a substantially horizontal portion of the inner metallic layer 77 is vertically spaced from a horizontal portion of the outer metallic layer 75 by the lower conductive material portion (76, 176). In one embodiment, an insulating spacer 74 can be provided, which can contact a sidewall of the trench (i.e., the backside contact trench 79) and an outer sidewall of the outer metallic layer 75.

In one embodiment, a bottom surface of the outer metallic layer 75 can be located at, or below, a topmost surface of the substrate (9, 10, 61). In one embodiment, the substantially horizontal portion of the inner metallic layer 77 can have a uniform thickness that is the same as the vertical separation distance between the lower conductive material portion (76, 176) and the upper conductive material portion (78, 178). In one embodiment, the height of the doped semiconductor material portion (76, 178) can be in a range from 50% to 98% of the total height of the contact via structure (75, 76, 77, 78), and the height of the metallic fill material portion (78, 176) can be in a range from 2% to 50%.

In one embodiment, the inner metallic layer 77 can comprise a conductive metallic nitride, and the metallic fill material portion (78 or 176) comprises a material selected from an elemental metal and an intermetallic alloy of at least two elemental metals. In the first embodiment, the lower conductive material portion 76 comprises a doped semiconductor material portion, and the upper conductive material portion 78 comprises a metallic fill material portion. In the second embodiment, the lower conductive material portion 176 comprises a metallic fill material portion, and the upper conductive material portion 178 comprises the doped semiconductor material portion.

In one embodiment, the monolithic three-dimensional memory device comprises a vertical NAND device located over the substrate, and the electrically conductive layers 46 comprise, or are electrically connected to, a respective word line of the NAND device. In one embodiment, the substrate (9, 10, 61) comprises a silicon substrate, the vertical NAND device comprises an array of monolithic three-dimensional NAND strings located over the silicon substrate. At least one memory cell in a first device level of the array of monolithic three-dimensional NAND strings is located over another memory cell in a second device level of the array of monolithic three-dimensional NAND strings. The silicon substrate can contain an integrated circuit comprising a driver circuit for the memory device located thereon.

The array of monolithic three-dimensional NAND strings can comprise a plurality of semiconductor channels (601, 602). At least one end portion of each of the plurality of semiconductor channels (601, 602) extends substantially perpendicular to a top surface of the substrate. The array of monolithic three-dimensional NAND strings can comprise a plurality of charge storage elements. Each charge storage element can be located adjacent to a respective one of the plurality of semiconductor channels (601, 602). The array of monolithic three-dimensional NAND strings can comprise a plurality of control gate electrodes having a strip shape extending substantially parallel to the top surface of the substrate. The plurality of control gate electrodes comprises at least a first control gate electrode located in the first device level and a second control gate electrode located in the second device level.

The methods and structures of the present disclosure provide a source electrode contact via structure 75, (76 or 176), 77, and (78 or 178) electrically connecting a component within a substrate (9, 10, 61) (such as a source region 61) through a stack of alternating layers including memory stack structures and to a metal interconnect structure overlying the stack of alternating layers.

The advantages of the embodiments of the disclosure include prevention or reduction of warpage of the substrate relative to other methods of forming contact via structures. Specifically, if the entire backside contact via structure (e.g., source electrode) is formed from a material under one type of stress, such as compressive or tensile stress, then this stress may be imposed on the substrate, which results in substrate warpage. For example, tungsten via structure material is typically under tensile stress in the device. To counteract the stress imposed by the tungsten via structure material on the substrate, the trench is at least partially filled with a material under an opposite (e.g., compressive) stress or neutral stress material (e.g., silicon) with the substrate, such as a first conductive material (e.g., polysilicon) portion. Thus, the contact via structure 75, (76 or 176), 77, and (78 or 178) includes a significant volume of a conductive doped semiconductor portion (76 or 178), and thus, a smaller volume of a metal portion (which can be a tungsten portion) compared with prior art structures. The higher semiconductor material content in the contact via structure 75, (76 or 176), 77, and (78 or 178) can reduce stress applied to surrounding structures, and reduce warpage of the three-dimensional memory structure.

Furthermore, the interconnect 95 contacts the metallic material in the source electrode rather than the semiconductor material. Resistance of wiring formed in the trench is thus decreased compared to where the interconnect 95 contacts doped silicon in the trench.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A monolithic three-dimensional memory device comprising:
    a stack of alternating layers comprising insulating layers and electrically conductive layers and located over a substrate;
    a memory stack structure extending through the stack and including a semiconductor channel;
    a trench vertically extending through the stack; and
    a contact via structure located in the trench, electrically connected to an end of the semiconductor channel, and comprising a vertical stack of a lower conductive material portion and an upper conductive material portion, wherein:
    one of the lower conductive material portion and the upper conductive material portion comprises a doped semiconductor material portion;
    another of the lower conductive material portion and the upper conductive material portion comprises a metallic fill material portion;
    the lower conductive material portion and the upper conductive material portion are vertically spaced from each other by a substantially horizontal portion of a inner metallic layer; and
    further comprising an outer metallic layer laterally surrounding the inner metallic layer and contacting an outer sidewall of the inner metallic layer, wherein the outer metallic layer contacts a bottom surface of the lower conductive material portion.

2. The monolithic three-dimensional memory device of claim 1, further comprising a source region located within the substrate and contacting the outer metallic layer.

3. The monolithic three-dimensional memory device of claim 1, wherein each surface of the lower conductive material portion contacts a surface selected from a sidewalls of the outer metallic layer, a top surface of a substantially horizontal portion of the outer metallic layer, and a bottom surface of a substantially horizontal portion of the inner metallic layer.

4. The monolithic three-dimensional memory device of claim 1, wherein the inner metallic layer and the outer metallic layer have topmost surfaces located within a first substantially horizontal plane that includes a top surface of a dielectric layer which overlies the memory stack structure.

5. The monolithic three-dimensional memory device of claim 1, wherein a substantially horizontal portion of the inner metallic layer is vertically spaced from a substantially horizontal portion of the outer metallic layer by the lower conductive material portion.

6. The monolithic three-dimensional memory device of claim 1, further comprising an insulating spacer contacting a sidewall of the trench and an outer sidewall of the outer metallic layer.

7. The monolithic three-dimensional memory device of claim 1, wherein a bottom surface of the outer metallic layer is located at, or below, a topmost surface of the substrate.

8. The monolithic three-dimensional memory device of claim 1, wherein the substantially horizontal portion of the inner metallic layer has a uniform thickness that is the same as a vertical separation distance between the lower conductive material portion and the upper conductive material portion.

9. The monolithic three-dimensional memory device of claim 1, wherein:
    a height of the doped semiconductor material portion is in a range from 50% to 98% of a total height of the contact via structure; and
    a height of the metallic fill material portion is in a range from 2% to 50%.

10. The monolithic three-dimensional memory device of claim 1, wherein:
    the inner metallic layer comprises a conductive metallic and metallic nitride barrier;
    the metallic fill material portion comprises a material selected from an elemental metal and an intermetallic alloy of at least two elemental metals.

11. The monolithic three-dimensional memory device of claim 1, wherein:
    the lower conductive material portion comprises the doped semiconductor material portion; and
    the upper conductive material portion comprises the metallic fill material portion.

12. The monolithic three-dimensional memory device of claim 1, wherein:
    the lower conductive material portion comprises the metallic fill material portion; and
    the upper conductive material portion comprises the doped semiconductor material portion.

13. The monolithic three-dimensional memory device of claim 1, wherein the doped semiconductor material portion comprises carbon doped silicon.

14. The monolithic three-dimensional memory device of claim 1, wherein:
    the monolithic three-dimensional memory device comprises a vertical NAND device located over the substrate;

the electrically conductive layers comprise, or are electrically connected to, a respective word line of the NAND device;

the substrate comprises a silicon substrate;

the vertical NAND device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon; and the array of monolithic three-dimensional NAND strings comprises:
- a plurality of semiconductor channels, wherein at least one end portion of each of the plurality of semiconductor channels extends substantially perpendicular to a top surface of the substrate;
- a plurality of charge storage elements, each charge storage element located adjacent to a respective one of the plurality of semiconductor channels; and
- a plurality of control gate electrodes having a strip shape extending substantially parallel to the top surface of the substrate, the plurality of control gate electrodes comprise at least a first control gate electrode located in the first device level and a second control gate electrode located in the second device level.

15. A monolithic three-dimensional memory device comprising:
- a stack of alternating layers comprising insulating layers and electrically conductive layers and located over a substrate;
- a memory stack structure extending through the stack and including a semiconductor channel;
- a trench vertically extending through the stack; and
- a contact via structure located in the trench, electrically connected to an end of the semiconductor channel, and comprising a vertical stack of a lower conductive material portion and an upper conductive material portion, wherein:
- one of the lower conductive material portion and the upper conductive material portion comprises a doped semiconductor material portion;
- another of the lower conductive material portion and the upper conductive material portion comprises a metallic fill material portion; and
- the lower conductive material portion and the upper conductive material portion are vertically spaced from each other by a substantially horizontal portion of a inner metallic layer,
wherein the monolithic three-dimensional memory device comprises at least one feature selected from:
- a first feature that a bottom surface of the outer metallic layer is located at, or below, a topmost surface of the substrate;
- a second feature that a height of the doped semiconductor material portion is in a range from 50% to 98% of a total height of the contact via structure and a height of the metallic fill material portion is in a range from 2% to 50%; and
- a third feature that the inner metallic layer comprises a conductive metallic and metallic nitride barrier and the metallic fill material portion comprises a material selected from an elemental metal and an intermetallic alloy of at least two elemental metals.

16. The monolithic three-dimensional memory device of claim 15, wherein the monolithic three-dimensional memory device comprises the first feature.

17. The monolithic three-dimensional memory device of claim 15, wherein the monolithic three-dimensional memory device comprises the second feature.

18. The monolithic three-dimensional memory device of claim 15, wherein the monolithic three-dimensional memory device comprises the third feature.

19. The monolithic three-dimensional memory device of claim 15, wherein the monolithic three-dimensional memory device comprises another feature selected from:
- a fourth feature that the lower conductive material portion comprises the doped semiconductor material portion, and the upper conductive material portion comprises the metallic fill material portion;
- a fifth feature that the lower conductive material portion comprises the metallic fill material portion, and the upper conductive material portion comprises the doped semiconductor material portion; and
- a sixth feature that the doped semiconductor material portion comprises carbon doped silicon.

20. The monolithic three-dimensional memory device of claim 15, further comprising:
- an outer metallic layer laterally surrounding the inner metallic layer and contacting an outer sidewall of the inner metallic layer, wherein the outer metallic layer contacts a bottom surface of the lower conductive material portion; and
- least one element selected from:
  - a source region located within the substrate and contacting the outer metallic layer; and
  - an insulating spacer contacting a sidewall of the trench and an outer sidewall of the outer metallic layer.

21. The monolithic three-dimensional memory device of claim 15, wherein:

the monolithic three-dimensional memory device comprises a vertical NAND device located over the substrate;

the electrically conductive layers comprise, or are electrically connected to, a respective word line of the NAND device;

the substrate comprises a silicon substrate;

the vertical NAND device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon; and the array of monolithic three-dimensional NAND strings comprises:
- a plurality of semiconductor channels, wherein at least one end portion of each of the plurality of semiconductor channels extends substantially perpendicular to a top surface of the substrate;
- a plurality of charge storage elements, each charge storage element located adjacent to a respective one of the plurality of semiconductor channels; and
- a plurality of control gate electrodes having a strip shape extending substantially parallel to the top surface of the substrate, the plurality of control gate electrodes comprise at least a first control gate electrode located in the first device level and a second control gate electrode located in the second device level.

22. A monolithic three-dimensional memory device comprising:
a stack of alternating layers comprising insulating layers and electrically conductive layers and located over a substrate;
a memory stack structure extending through the stack and including a semiconductor channel;
a trench vertically extending through the stack; and
a contact via structure located in the trench, electrically connected to an end of the semiconductor channel, and comprising a vertical stack of a lower conductive material portion and an upper conductive material portion, wherein:
one of the lower conductive material portion and the upper conductive material portion comprises a doped semiconductor material portion;
another of the lower conductive material portion and the upper conductive material portion comprises a metallic fill material portion; and
the lower conductive material portion and the upper conductive material portion are vertically spaced from each other by a substantially horizontal portion of a inner metallic layer,
wherein the monolithic three-dimensional memory device comprises a feature selected from:
a first feature that the lower conductive material portion comprises the doped semiconductor material portion, and the upper conductive material portion comprises the metallic fill material portion;
a second feature that the lower conductive material portion comprises the metallic fill material portion, and the upper conductive material portion comprises the doped semiconductor material portion; and
a third feature that the doped semiconductor material portion comprises carbon doped silicon.

23. The monolithic three-dimensional memory device of claim 22, wherein the monolithic three-dimensional memory device comprises the first feature.

24. The monolithic three-dimensional memory device of claim 22, wherein the monolithic three-dimensional memory device comprises the second feature.

25. The monolithic three-dimensional memory device of claim 22, wherein the monolithic three-dimensional memory device comprises the third feature.

26. The monolithic three-dimensional memory device of claim 22, further comprising an outer metallic layer laterally surrounding the inner metallic layer and contacting an outer sidewall of the inner metallic layer, wherein the outer metallic layer contacts a bottom surface of the lower conductive material portion.

27. The monolithic three-dimensional memory device of claim 26, further comprising at least one element selected from:
a source region located within the substrate and contacting the outer metallic layer; and
an insulating spacer contacting a sidewall of the trench and an outer sidewall of the outer metallic layer.

28. The monolithic three-dimensional memory device of claim 26, wherein the monolithic three-dimensional memory device comprises an additional feature selected from:
a feature that each surface of the lower conductive material portion contacts a surface selected from a sidewalls of the outer metallic layer, a top surface of a substantially horizontal portion of the outer metallic layer, and a bottom surface of a substantially horizontal portion of the inner metallic layer;
a feature that the inner metallic layer and the outer metallic layer have topmost surfaces located within a first substantially horizontal plane that includes a top surface of a dielectric layer which overlies the memory stack structure; and
a feature that a substantially horizontal portion of the inner metallic layer is vertically spaced from a substantially horizontal portion of the outer metallic layer by the lower conductive material portion.

29. The monolithic three-dimensional memory device of claim 22, wherein:
the monolithic three-dimensional memory device comprises a vertical NAND device located over the substrate;
the electrically conductive layers comprise, or are electrically connected to, a respective word line of the NAND device;
the substrate comprises a silicon substrate;
the vertical NAND device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon; and
the array of monolithic three-dimensional NAND strings comprises:
a plurality of semiconductor channels, wherein at least one end portion of each of the plurality of semiconductor channels extends substantially perpendicular to a top surface of the substrate;
a plurality of charge storage elements, each charge storage element located adjacent to a respective one of the plurality of semiconductor channels; and
a plurality of control gate electrodes having a strip shape extending substantially parallel to the top surface of the substrate, the plurality of control gate electrodes comprise at least a first control gate electrode located in the first device level and a second control gate electrode located in the second device level.

* * * * *